(12) United States Patent
Yazdani

(10) Patent No.: US 9,818,680 B2
(45) Date of Patent: Nov. 14, 2017

(54) SCALABLE SEMICONDUCTOR INTERPOSER INTEGRATION

(71) Applicant: BroadPak Corporation, San Jose, CA (US)

(72) Inventor: Farhang Yazdani, Santa Clara, CA (US)

(73) Assignee: BroadPak Corporation, San Jose, CA (US)

( * ) Notice: Subject to any disclaimer, the term of this patent is extended or adjusted under 35 U.S.C. 154(b) by 0 days.

(21) Appl. No.: 14/746,045

(22) Filed: Jun. 22, 2015

(65) Prior Publication Data

US 2015/0287672 A1    Oct. 8, 2015

Related U.S. Application Data

(63) Continuation of application No. 14/717,798, filed on May 20, 2015, which is a continuation of application No. 13/192,217, filed on Jul. 27, 2011.
(Continued)

(51) Int. Cl.
*H05K 1/11* (2006.01)
*H05K 1/14* (2006.01)
(Continued)

(52) U.S. Cl.
CPC ...... *H01L 23/49827* (2013.01); *H01L 21/486* (2013.01); *H01L 21/52* (2013.01);
(Continued)

(58) Field of Classification Search
CPC . H01L 2924/10253; H01L 2924/30107; H01L 21/486; H01L 21/52; H01L 2224/48227; H01L 2225/06513; H01L 2225/06517; H01L 2225/06527; H01L 2225/06541; H01L 2225/06548; H01L 2225/06572
See application file for complete search history.

(56) References Cited

U.S. PATENT DOCUMENTS 5,128,831 A * 7/1992 Fox, III ............ H01L 23/49827
257/697
5,898,909 A * 4/1999 Yoshihara ............ H01L 23/552
257/E23.114

(Continued)

OTHER PUBLICATIONS

U.S. Appl. No. 12/205,875, Non-Final Office Action dated Feb. 3, 2011.
(Continued)

*Primary Examiner* — Yuriy Semenenko
(74) *Attorney, Agent, or Firm* — Aslan Law, P.C.

(57) ABSTRACT

Semiconductor packages are described which increase the density of electronic components within. The semiconductor package may incorporate interposers with cavities formed into the top and/or bottom. The cavities may then be used as locations for the electronic components. Alternatively, narrow spacer interposers may be used to space apart standard more laterally elongated interposers to form the indentations used to house the electronic components. The semiconductor package designs described herein may be used to reduce footprint, reduce profile and increase electronic component and transistor density for semiconductor products.

4 Claims, 20 Drawing Sheets

Related U.S. Application Data

(60) Provisional application No. 62/015,459, filed on Jun. 22, 2014.

(51) Int. Cl.

| | |
|---|---|
| *H01L 23/498* | (2006.01) |
| *H01L 25/065* | (2006.01) |
| *H01L 23/66* | (2006.01) |
| *H01L 21/48* | (2006.01) |
| *H01L 21/52* | (2006.01) |
| *H01L 23/04* | (2006.01) |
| *H01L 23/31* | (2006.01) |
| *H01L 23/473* | (2006.01) |
| *H01L 25/18* | (2006.01) |
| *H01L 25/00* | (2006.01) |
| *H01L 23/00* | (2006.01) |

(52) U.S. Cl.
CPC .......... *H01L 23/04* (2013.01); *H01L 23/3107* (2013.01); *H01L 23/473* (2013.01); *H01L 23/49833* (2013.01); *H01L 23/49838* (2013.01); *H01L 23/573* (2013.01); *H01L 23/66* (2013.01); *H01L 25/0652* (2013.01); *H01L 25/0657* (2013.01); *H01L 25/18* (2013.01); *H01L 25/50* (2013.01); H01L 24/48 (2013.01); *H01L 2224/48227* (2013.01); *H01L 2225/06513* (2013.01); *H01L 2225/06517* (2013.01); *H01L 2225/06527* (2013.01); *H01L 2225/06541* (2013.01); *H01L 2225/06548* (2013.01); *H01L 2225/06572* (2013.01); *H01L 2924/00014* (2013.01); *H01L 2924/10253* (2013.01); *H01L 2924/19041* (2013.01); *H01L 2924/30107* (2013.01); *Y10T 29/53174* (2015.01); *Y10T 29/53178* (2015.01); *Y10T 29/53183* (2015.01)

(56) References Cited

U.S. PATENT DOCUMENTS

| | | |
|---|---|---|
| 6,376,769 B1 | 4/2002 | Chung |
| 7,317,256 B2 | 1/2008 | Williams et al. |
| 7,474,540 B1 | 1/2009 | Dang et al. |
| 7,535,105 B2 | 5/2009 | Voldman |
| 8,014,166 B2 | 9/2011 | Yazdani |
| 9,093,396 B2 | 7/2015 | Lee |
| 2004/0012938 A1 | 1/2004 | Sylvester et al. |
| 2005/0061545 A1 | 3/2005 | Rosenau et al. |
| 2005/0184825 A1* | 8/2005 | Oran ............... H01L 23/66 333/33 |
| 2006/0001179 A1* | 1/2006 | Fukase ............. H01L 23/147 257/778 |
| 2006/0249302 A1 | 11/2006 | Hall et al. |
| 2006/0273455 A1 | 12/2006 | Williams et al. |
| 2007/0029646 A1 | 2/2007 | Voldman |
| 2007/0045796 A1 | 3/2007 | Ye et al. |
| 2007/0235850 A1* | 10/2007 | Gerber ............. H01L 21/4853 257/678 |
| 2008/0265399 A1 | 10/2008 | Chao |
| 2008/0296697 A1 | 12/2008 | Hsu et al. |
| 2009/0267171 A1* | 10/2009 | Yean .................. H01L 23/13 257/434 |
| 2010/0008058 A1 | 1/2010 | Saen et al. |
| 2010/0315787 A1 | 12/2010 | Li et al. |
| 2011/0019368 A1 | 1/2011 | Andry et al. |
| 2013/0286620 A1 | 10/2013 | Colussi et al. |
| 2014/0035114 A1 | 2/2014 | Gogoi et al. |
| 2015/0255434 A1* | 9/2015 | Yazdani ............. H01L 21/486 257/737 |
| 2015/0287672 A1 | 10/2015 | Yazdani |
| 2016/0126174 A1 | 5/2016 | Shen et al. |
| 2016/0372448 A1 | 12/2016 | Yazdani |

OTHER PUBLICATIONS

U.S. Appl. No. 12/205,875, Notice of Allowance dated Jun. 27, 2011.
U.S. Appl. No. 12/205,875, Requirement for Restriction/Election dated Nov. 29, 2010.
U.S. Appl. No. 13/192,217, Final Office Action dated Jun. 13, 2013.
U.S. Appl. No. 13/192,217, Final Office Action dated Nov. 13, 2015.
U.S. Appl. No. 13/192,217, Non-Final Office Action dated Jan. 18, 2013.
U.S. Appl. No. 13/192,217, Non-Final Office Action dated Sep. 17, 2013.
U.S. Appl. No. 13/192,217, Non-Final Office Action dated Aug. 9, 2016.
U.S. Appl. No. 14/717,798, Non-Final Office Action dated May 12, 2016.
U.S. Appl. No. 14/717,798, Requirement for Restriction/Election dated Oct. 15, 2015.
U.S. Appl. No. 14/717,798, Final Office Action dated Nov. 16, 2016.
U.S. Appl. No. 15/164,866, Requirement for Restriction/Election dated Dec. 2, 2016.

* cited by examiner

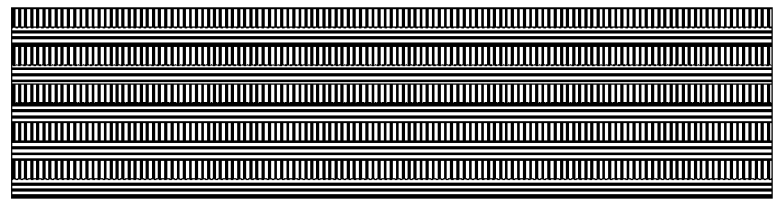
FIG. 16A
Top View
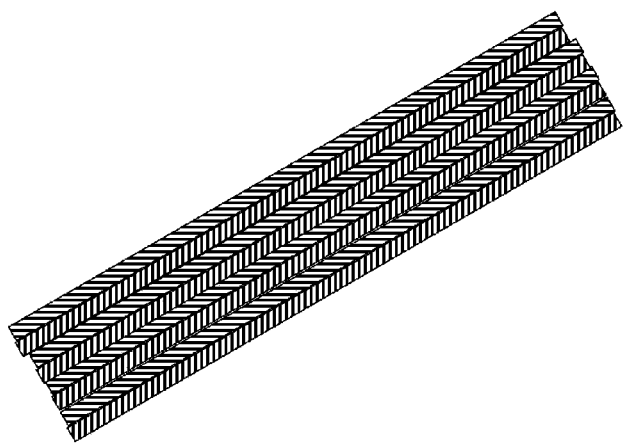
FIG. 16B
Top View
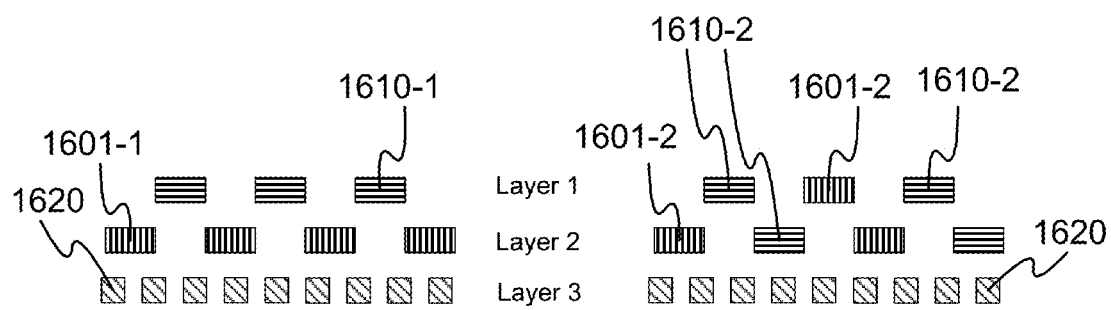
FIG. 16C        FIG. 16D

SCALABLE SEMICONDUCTOR INTERPOSER INTEGRATION

CROSS-REFERENCES TO RELATED APPLICATIONS

The present application claims benefit under 35 USC 119 (e) of U.S. Provisional Application No. 62/015,459 filed Jun. 22, 2014, entitled "METHOD OF MAKING TAMPER RESISTANT SECURITY ENABLED THERMALLY ENHANCED AND SCALABLE 2.5D/3D PACKAGE", the content of which is incorporated herein by reference in its entirety.

The present application claims benefit and is a continuation-in-part of application Ser.No. 14/717,798 filed May 20, 2015, entitled "SEMICONDUCTOR INTERPOSER INTEGRATION", the content of which is incorporated herein by reference in its entirety.

The present application claims benefit and is a continuation-in-part of application Ser.No. 13/192,217 filed Jul. 27, 2011, entitled "STACKING INTEGRATED CIRCUITS CONTAINING SERIALIZER AND DESERIALIZER BLOCKS USING THROUGH SILICON VIA", the content of which is incorporated herein by reference in its entirety.

FIELD

The subject matter herein relates to packaging semiconductor devices.

BACKGROUND

The packaging of electronic devices is becoming more important as demands increase for miniaturization, speed, improved reliability, weight reduction and security. A variety packages are under development such as a die-scale package, at a wafer level; and a die stack-type package. Die have been attached to an interposer to mount the die onto a printed circuit board (PCB) through an organic package substrate to translate the fine geometries of the interposer to the much larger spacing of the printed circuit board. An increasing number of conductive pads of the printed circuit board must be coordinated with more bonding pads on the semiconductor die to improve input/output (I/O) throughput.

As Moore's law approaches its decrescendo and the cost per transistor increases below the 22 nm node, device makers are seeking alternative solutions to stay competitive. Semiconductor device manufacturers have been relying on Multi-Chip-Module (MCM) 100 shown in FIGS. 1A and 1B. 2D monolithic dies (120, 130) are integrated on an organic substrate 160 assembled on a Printed Circuit Board (PCB) 110. 2D monolithic dies 120 may be flip chip dies mechanically and electrically connected to organic substrate 160 by way of solder bumps 140. Alternatively, 2D monolithic dies 130 may be electrically connected to organic substrate 160 by way of wirebonds 131. Ball Grid Array (BGA) 150 may be used to connect organic substrate 160 to PCB 110. This approach results in a relatively low yield due to the increase in substrate size which causes mechanical stresses and other yield killing effects.

These shortcomings were partially addressed by moving to a Package-on-Package (POP) architecture as shown in FIGS. 2A and 2B. A Package-on-Package architecture may possess a vertical stacking of one monolithic die 201 above a second monolithic die 202 in the depicted manner. Monolithic die 201 and monolithic die 202 each have their own organic substrate (231 and 232, respectively). Monolithic die 201 is individually packaged on organic substrate 231 using solder balls 221 whereas monolithic die 202 is individually packaged onto organic substrate 232 using solder balls 222. Clearance is provided for monolithic die 202 by incorporating organic substrates 210 which may provide electrical connections between organic substrate 231 and organic substrate 232 through additional solder balls 220. Practical considerations (e.g. reliability and maintaining a low profile) limit the number of levels which can be implemented in this Package-on-Package architecture. A perspective view is provided in FIG. 2B to help visualize the completed package in three dimensions. The size of the solder bumps may be increased and provide the clearance for monolithic die 202 which does indeed lower the profile, however, the technique also reduces the number of electrical connections which may be made between organic substrate 231 and organic substrate 232.

More recently, "2.5D" and "3D" integration techniques have been developed to improve yield, profile and performance. 2.5D/3D approaches may also increase the reuse of monolithic integrated circuit ("chip") designs whose development costs have already been amortized. Various chip designs (often referred to as IP) perhaps from differing process nodes and perhaps from different foundries can be integrated together to form a functional circuit device. In a homogeneous 2.5D/3D integration approach, as illustrated in FIG. 3A, a single chip 300 is partitioned into number of smaller chips (305, 310, 315, 320). Smaller chips (305, 310, 315, 320) are then assembled onto interposer 325 and wired together to form an electronic package. FIG. 3B shows a heterogeneous 2.5D/3D integration approach. Single chip 330 includes a number of circuitry blocks including memory 335, logic 340, DSP 345, and RF 350 manufactured separately and mounted on interposer 355 and wired together to form an electronic package. Smaller chips (335, 340, 345, 350) may be manufactured by different foundries and may have different process nodes selected for performance, availability and/or cost reasons.

Hardware is needed which further increase the number of transistors per device to improve processing performance and/or lower the cost per transistor.

SUMMARY

Semiconductor packages are described which increase the density of electronic components within. The semiconductor package may incorporate interposers with cavities formed into the top and/or bottom. The cavities may then be used as locations for the electronic components. Alternatively, narrow spacer interposers may be used to space apart standard more laterally elongated interposers to form the indentations used to house the electronic components. The height of the clearance is equal to the height of the standoff interposers in embodiments. The semiconductor package designs described herein may be used to reduce footprint, reduce profile and increase electronic component and transistor density for semiconductor products. The cavities and clearances may form a conduit configured to promote fluid flow and enhance cooling of the integrated circuits during operation in embodiments.

Embodiments disclosed herein pertain to electronic packages including a substantially-planar first semiconductor interposer. The first semiconductor interposer includes a first plurality of through-substrate vias perpendicular to the major plane of the first semiconductor interposer and passing through the entire thickness of the first semiconductor interposer. Embodiments further include a substantially-planar second semiconductor interposer having a second major plane parallel to the first major plane. The second semiconductor interposer includes a second plurality of through-substrate vias perpendicular to the major plane of the second semiconductor interposer and passing through the entire thickness of the second semiconductor interposer. Embodiments further include at least one standoff interposer disposed between the first semiconductor interposer and the second semiconductor interposer. The at least one standoff interposer is affixed to each of the first semiconductor interposer and the second semiconductor interposer. The at least one standoff interposer forms a clearance between the first semiconductor interposer and the second semiconductor interposer. The standoff interposer includes an intervening plurality of through-substrate vias passing through the entire thickness of the at least one standoff interposer. A portion of the second plurality of through-substrate vias are electrically connected to a portion of the first through-substrate vias by way of a portion of the intervening through-substrate vias. Embodiments further include at least one electronic component disposed within the clearance and electrically coupled to the first semiconductor interposer by a first plurality of electrical connections.

Each of the first semiconductor interposer, the second semiconductor interposer and the standoff interposer may be crystalline silicon or single crystal silicon. The at least one standoff interposer may include at least two standoff interposers forming two parallel lines near two opposing edges of the first semiconductor interposer. The clearance may be the region between the two parallel lines and between the first semiconductor interposer and the second semiconductor interposer. The at least one standoff interposer may encircle the clearance resulting in no pathways for fluid egress or ingress. In other words, the standoff may go all the way around the perimeter of the interposers above and below to increase security in embodiments. The at least one standoff interposer may include at least nine standoff interposers arranged in a regular grid pattern. A width of the standoff interposer may be between 5% and 45% of a width of the interposer. A height of the standoff interposer may be between 50 μm and 300 μm. Embodiments may further include a cloaking plurality of through-substrate vias through the standoff interposer ground on the outside of the intervening plurality of through-substrate vias. A cloaking linear density of the cloaking plurality of through-substrate vias may exceed the intervening linear density of the intervening plurality of through-substrate vias.

Embodiments disclosed herein pertain to electronic packages including a substantially-planar first semiconductor interposer having a rectilinear cavity formed into one or more of a top surface of the first semiconductor interposer or the bottom surface of the first semiconductor interposer when the first major plane of the first semiconductor interposer is positioned horizontally. The first semiconductor interposer includes a first plurality of through-substrate vias perpendicular to the major plane of the first semiconductor interposer and passing through the entire thickness of the first semiconductor interposer. The first through-substrate vias are disposed outside the rectilinear cavity. Embodiments further include a substantially-planar second semiconductor interposer having a second major plane parallel to the first major plane. The second semiconductor interposer includes a second plurality of through-substrate vias perpendicular to the major plane of the second semiconductor interposer and passing through the entire thickness of the second semiconductor interposer. A portion of the second plurality of through-substrate vias are electrically connected to a portion of the first plurality of through-substrate vias. Embodiments further include at least one electronic component disposed entirely within the rectilinear cavity and electrically coupled to the first semiconductor interposer by a first plurality of electrical connections within the rectilinear cavity.

At least one electronic component may include at least one monolithic integrated circuit. Each of the first semiconductor interposer and the second semiconductor interposer may be silicon interposers. A width of the rectilinear cavity may be between 10% and 90% of the width of the first semiconductor interposer. The widths of the first semiconductor interposer and the second semiconductor interposer may be essentially the same. A depth of the rectilinear cavity may be between 50 μm and 300 μm.

Embodiments disclosed herein pertain to electronic packages including a substantially-planar first semiconductor interposer. The first semiconductor interposer includes a first plurality of electrical connections generally perpendicular to the major plane of the first semiconductor interposer and passing through the thickness of the first semiconductor interposer. Embodiments further include a substantially-planar second semiconductor interposer having a second major plane parallel to the first major plane. The second semiconductor interposer includes a second plurality of electrical connections generally perpendicular to the major plane of the second semiconductor interposer and passing through the thickness of the second semiconductor interposer. A portion of the second plurality of electrical connections are electrically connected to a portion of the first plurality of electrical connections. A first space is disposed between the first semiconductor interposer and the second semiconductor interposer. Embodiments further include a substantially-planar third interposer having a third major plane parallel to the first major plane. A second space is disposed between the third interposer and the second semiconductor interposer. Embodiments further include at least one first electronic component disposed between the first semiconductor interposer and the second semiconductor interposer.

The first space may include a cavity. The first space may include a clearance between two or more standoff interposers. The first space may be configured to pass a cooling fluid to keep an operating temperature of the at least one first electronic component below a threshold value. The at least one first electronic component may be encapsulated within a molding compound filling the remainder of the first space. All electrical connections between the first semiconductor interposer and the second semiconductor interposer may be direct ohmic contacts. The third interposer may have no electrical connections on top as a security measure. The portion of the first plurality of electrical connections and the portion of the second plurality of electrical connections are essentially directly electrically connected to one another with no intervening interposer. The portion of the first plurality of electrical connections and the portion of the second plurality of electrical connections are electrically connected by way of one or more standoff interposer. The third semiconductor interposer may include a third plurality of electrical connections generally perpendicular to the major plane of the third semiconductor interposer and passing through the thickness of the third semiconductor interposer. A portion of the third plurality of electrical connections are electrically connected to a portion of the second plurality of electrical connections. Embodiments may further include a sensor affixed to the top of the third semiconductor interposer and electrically connected to a portion of the third plurality of electrical connections. At least one of the at least one first electronic component and at least one of the at least one second electronic component may be a monolithic integrated circuit, a passive electronic component, an antenna, a sensor, or a power source. The third interposer may be a cap having no electrical connections on top. Embodiments may further include at least one second electronic component disposed between the semiconductor interposer and the third interposer. At least two of the at least one first electronic component may be keyed such that two of the electronic components will only operate properly when both are present.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

FIGS. 16A, 16B, 16C and 16D are top-view schematics of portions of semiconductor packages according to embodiments.

Figure 1A:
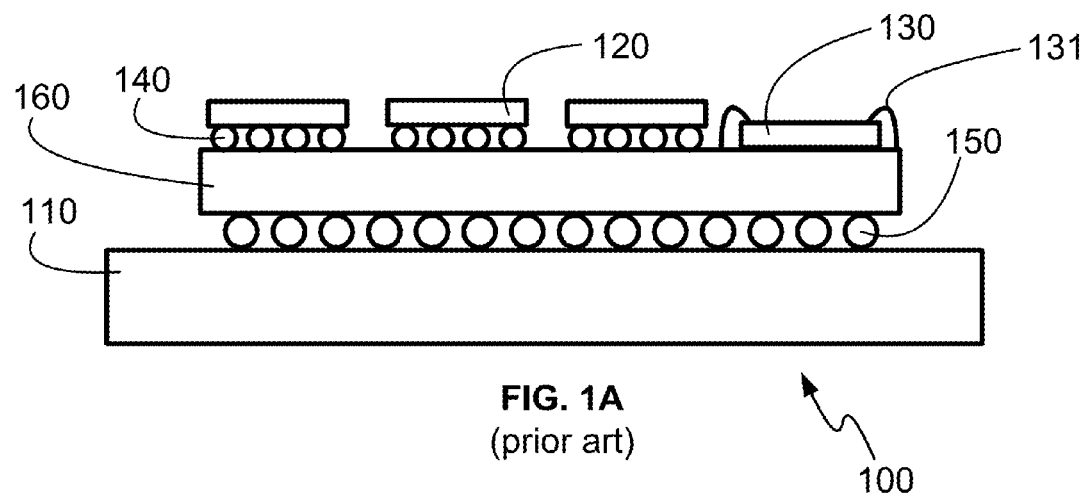
FIG. 1A is a side-view schematic of a Multi-Chip-Module package according to the prior art.
Figure 1B:
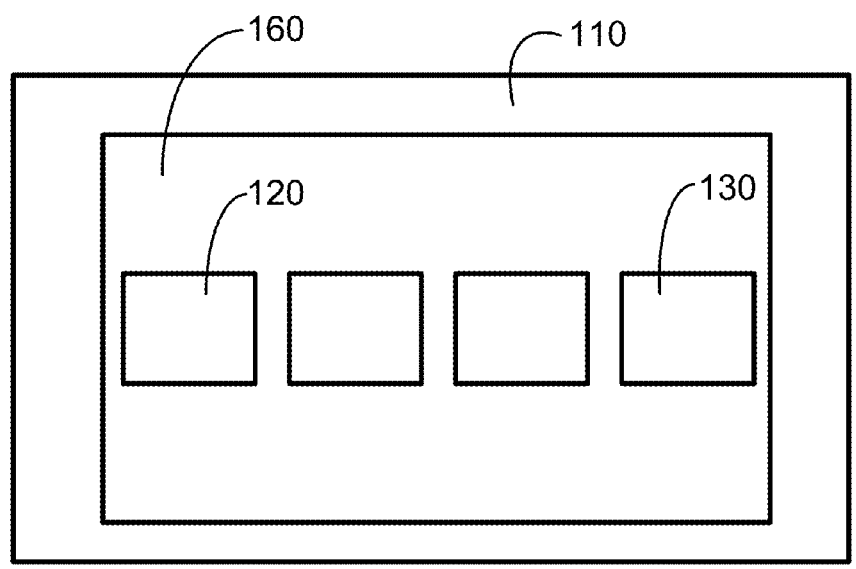
FIG. 1B is a top-view schematic of a Multi-Chip Module package according to the prior art.
Figure 2A:
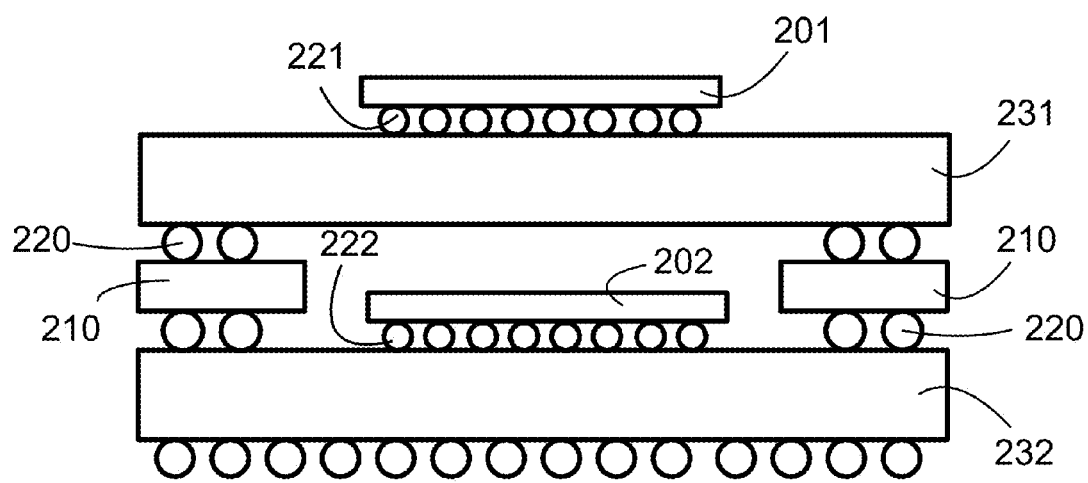
FIG. 2A is a side-view schematic of a Package-on-Package architecture according to the prior art.
Figure 2B:
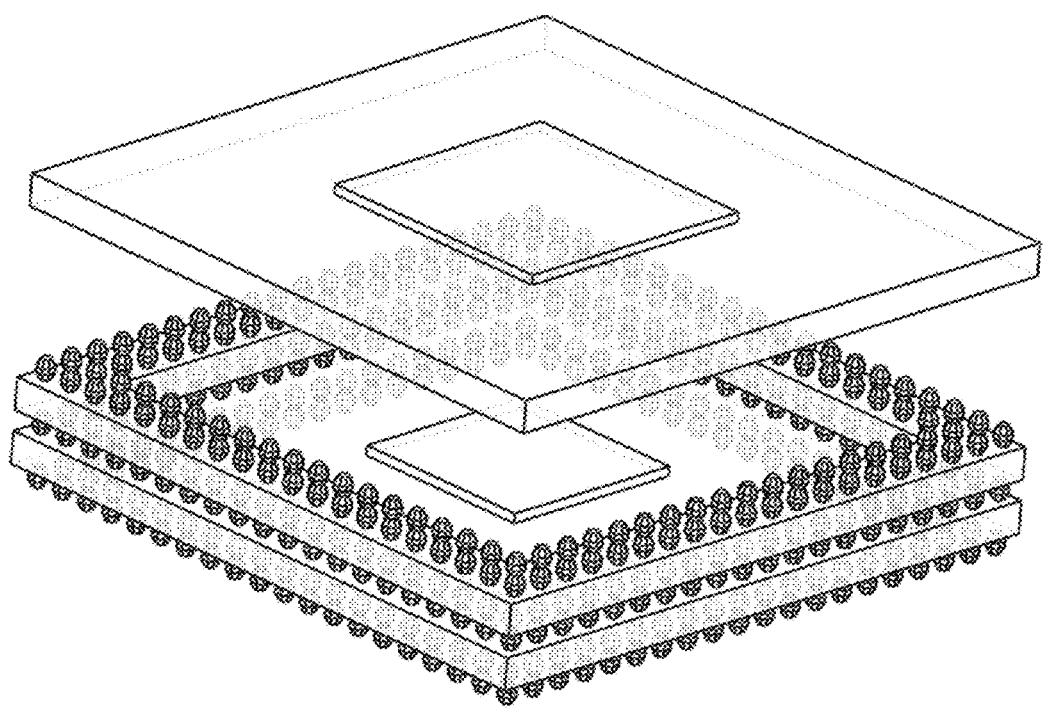
FIG. 2B is a perspective-view schematic of a Package-on-Package architecture according to the prior art.
Figure 3A:
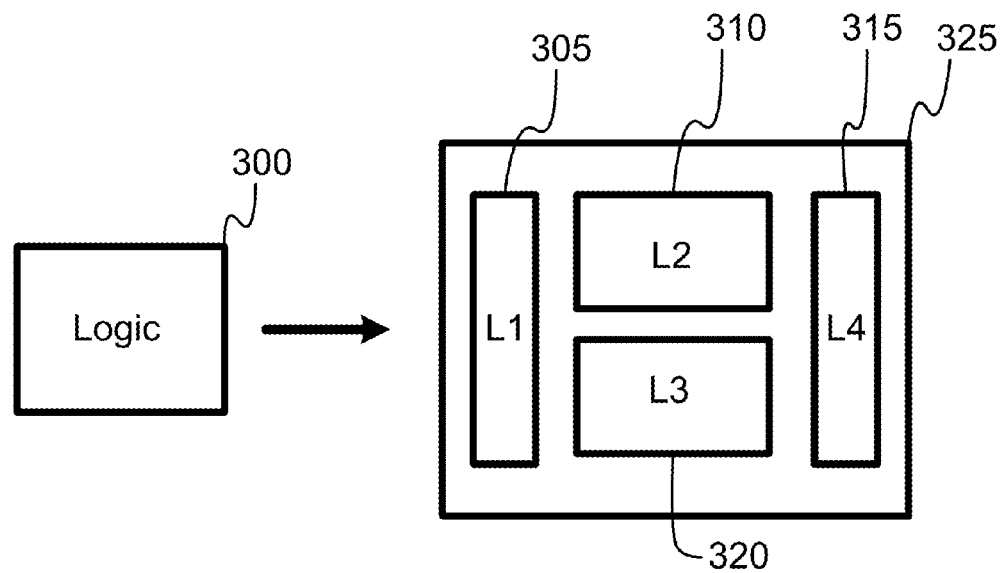
FIG. 3A is a top-view schematic of homogeneous partitioning according to the prior art.
Figure 3B:
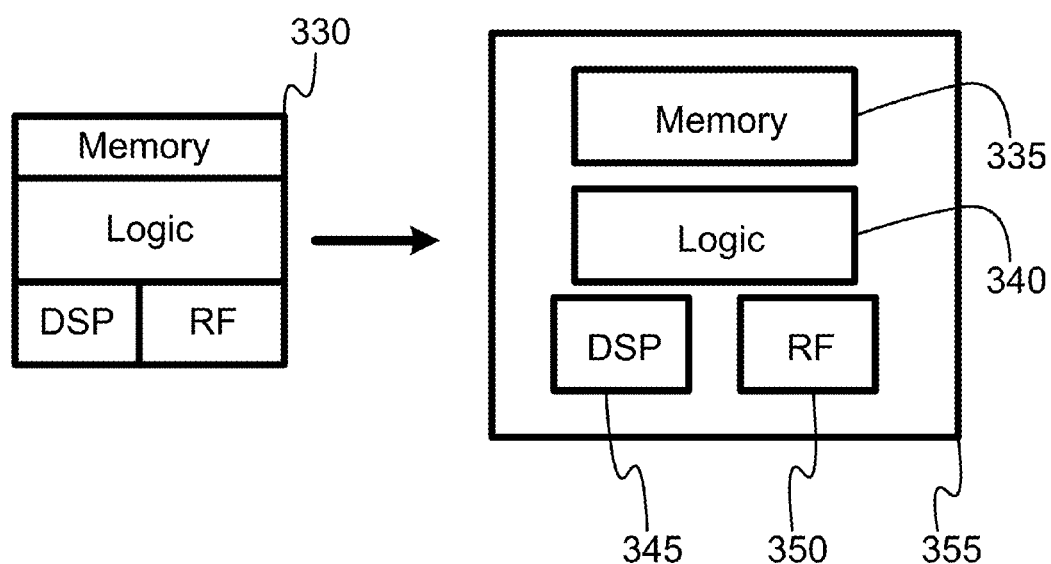
FIG. 3B is a top-view schematic of heterogeneous partitioning according to the prior art.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Semiconductor packages are described which increase the density of electronic components within. The semiconductor package may incorporate interposers with cavities formed into the top and/or bottom. The cavities may then be used as locations for the electronic components. Alternatively, narrow spacer interposers may be used to space apart standard more laterally elongated interposers to form the indentations used to house the electronic components. The height of the clearance is equal to the height of the standoff interposers in embodiments. The semiconductor package designs described herein may be used to reduce footprint, reduce profile and increase electronic component and transistor density for semiconductor products. The cavities and clearances may form a conduit configured to promote fluid flow and enhance cooling of the electronic components during operation in embodiments.

The semiconductor packages described herein possess cavities and/or standoff interposers to create spaces for a plurality of electronic components in a high density and high performance configuration. In embodiments, the semiconductor packages described may result in a smaller footprint, lower profile, miniaturized, higher performance, and thermally enhanced, and more secure packages. The packages may involve a combination of interposers, redistribution layers (RDL), through-substrate vias (TSV), so-called "zero-ohm" links, copper pillars, solder bumps, compression bonding, and bumpless packaging. In addition to these techniques, cavities may be made into the interposer and/or standoff interposers may be used to provide spaces (clearance) for a plurality of electronic components (e.g. passives, antennas, integrated circuits or chips) in embodiments. The standoff interposers may include redistribution layers on the top and/or bottom while a through-substrate via passes vertically through the standoff interposer. Standoff interposers may be formed, for example, by bonding multiple interposers together by thermocompression bonding or another low-profile connection technique. Oxide bonding techniques or laterally shifting any standoff interposer described herein enable wirebonds to be used to connect the standoff interposer to a printed circuit board, a substrate, or an underlying interposer in embodiments. Generally speaking, any interposer described herein may be shifted relative to the other interposers in the stack to allow the formation of wirebonds. The semiconductor interposer may be a silicon interposer according to embodiments.

Electronic packages formed in the manner described herein possess improved reliability, lower cost, and higher performance due to a shortening of electrical distance and an increase in density of integrated circuit mounting locations. Reliability may be improved for embodiments which use the same semiconductor (e.g. silicon) for all interposers used to form the semiconductor package. The techniques presented also provide improvement in solder joint reliability and a reduction in warpage. Warping may occur during the wafer processing and thinning of the semiconductor interposer. The second opportunity for warping occurs during the packaging and assembly. The chance of warping increases for larger interposer lengths and package dimensions which is currently necessary for a variety of 2.5D/3D integration applications (e.g. networking). The vertical density of integrated circuits may be increased which allows the horizontal area to be reduced to achieve the same performance.

Figure 4A:
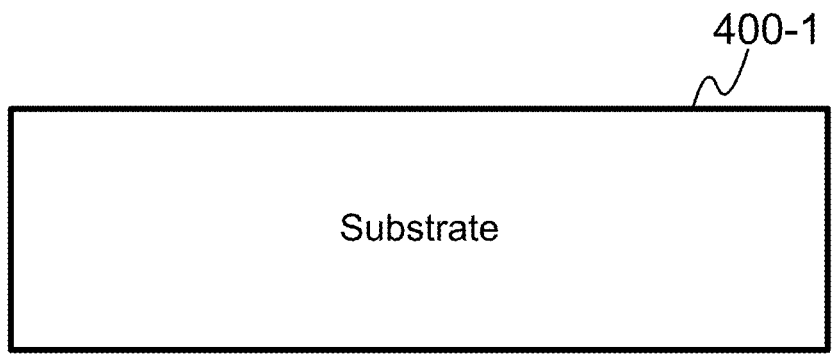
FIGS. 4A, 4B and 4C are side-view schematics of interposers during the formation of cavities according to embodiments.
Figure 4B:
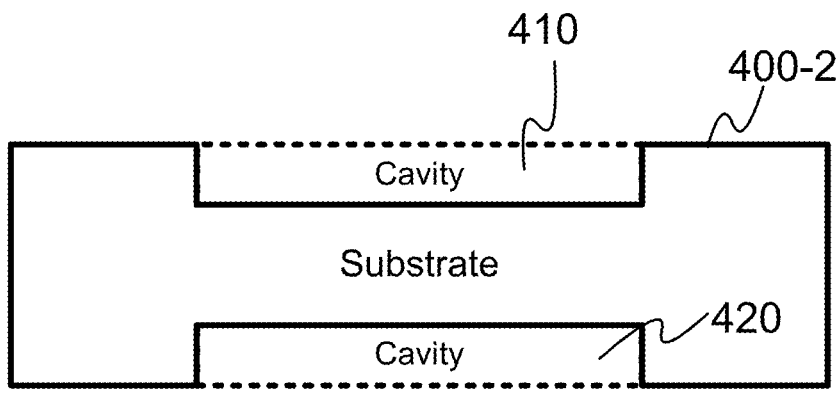
Figure 4C:
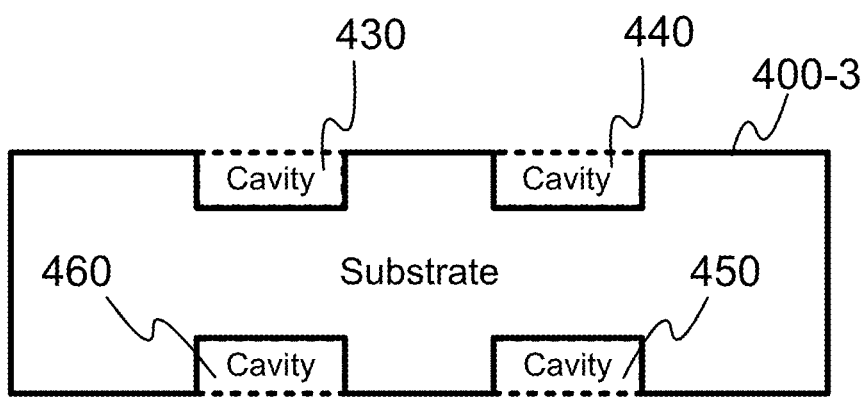

FIGS. 4A, 4B and 4C are side-view schematics of interposers during the formation of cavities according to embodiments. An interposer 400-1 is shown in FIG. 4A prior to forming any cavities for electronic components. FIG. 4B shows an interposer 400-2 having a top cavity 410 as well as a bottom cavity 420. FIG. 4C shows an interposer 400-3 having four cavities (430, 440, 450, 460) formed into its top and bottom surfaces. The dotted lines define the extent of the cavity in the direction of the opening for the purposes of determining whether a die is within the cavity or entirely within the cavity herein.

When describing all embodiments herein, "Top" and "Up" will be used herein to describe portions/directions perpendicularly distal from the printed circuit board (PCB) plane and further away from the center of mass of the PCB in the perpendicular direction. "Vertical" will be used to describe items aligned in the "Up" direction towards the "Top". Other similar terms may be used whose meanings will now be clear. "Major planes" of objects will be defined as the plane which intersects the largest area of an object such as an interposer. Some standoff interposers may be "aligned" in "lines" along the longest of the three dimensions and may therefore be referred to as "linear" standoff interposers. Electrical connections may be made between interposers (standoff or planar interposer) and the pitch of the electrical connections may be between 1 µm and 150 µm or between 10 µm and 100 µm in all embodiments described herein. Electrical connections between neighboring semiconductor interposers herein may be direct ohmic contacts which may include direct bonding/oxide bonding or adding a small amount of metal such as a pad between, for example, through silicon vias.

Figure 5A:
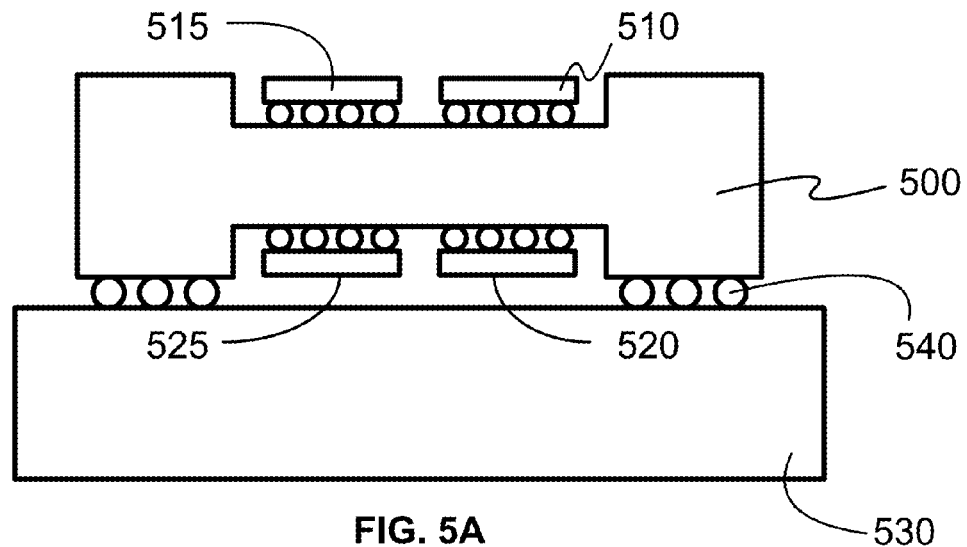
FIGS. 5A and 5B are side-view schematics of portions of semiconductor packages with electronic components positioned in cavities according to embodiments.
Figure 5B:
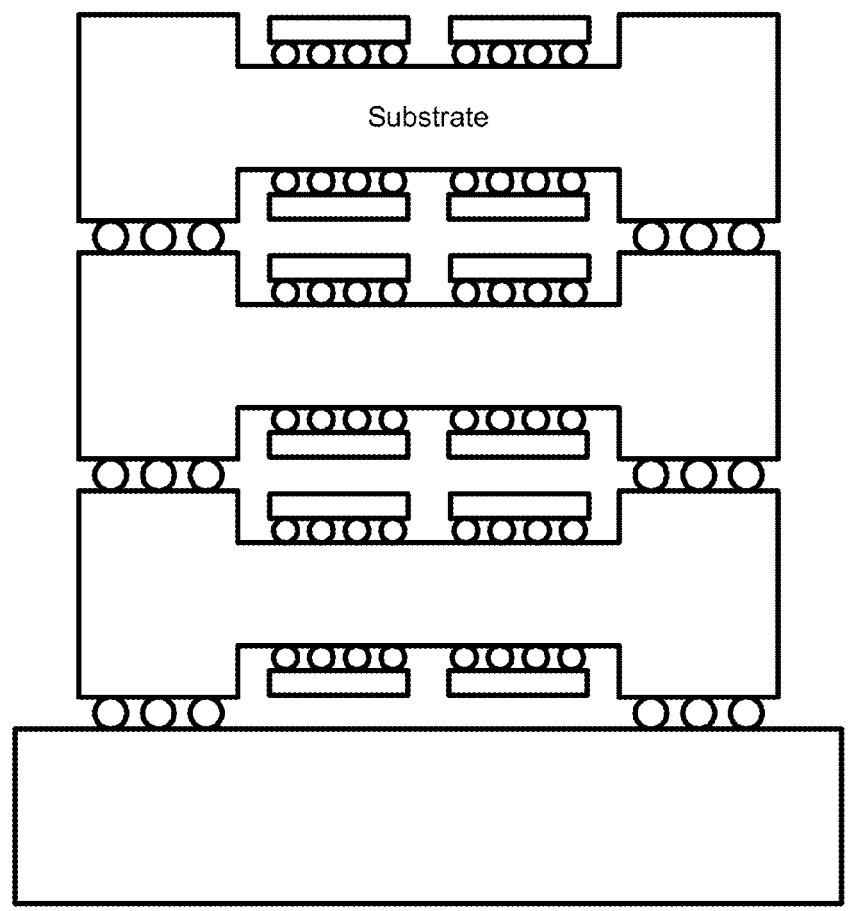

FIGS. 5A and 5B are side-view schematics of interposers with electronic components positioned in cavities according to embodiments. Following the formation of cavities in interposer 500, four electronic components (dies 510, 515, 520, 525) are then assembled within the cavities using a variety of electrical connection methods (e.g. copper pillar or micro bumps). A plurality of dies are placed within or entirely within a cavity of an interposer in embodiments. Interposer 500 is then electrically and mechanically attached to printed circuit board 530 using solder balls 540. Multiple interposers having dies placed in cavities may be stacked vertically and electrically/mechanically attached to a printed circuit board, according to embodiments, as further shown in FIG. 5B.

Figure 6A:
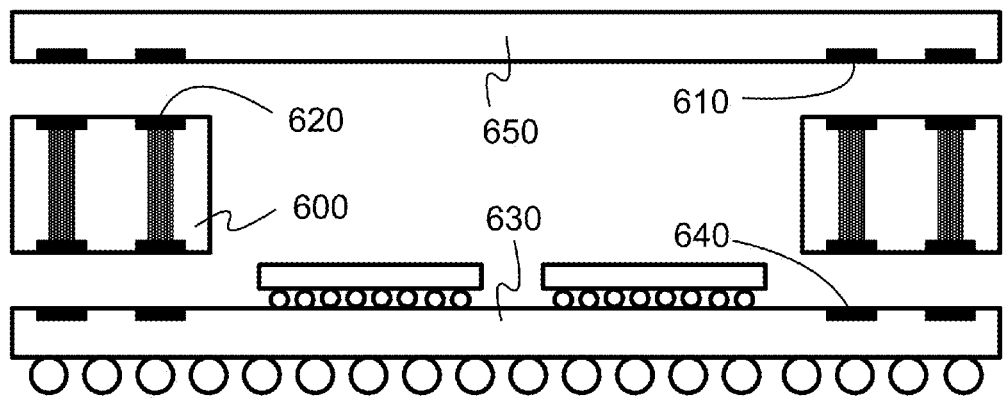
FIGS. 6A and 6B are side-view schematics of portions of semiconductor packages with electronic components positioned in a clearance created by standoff interposers according to embodiments.
Figure 6B:
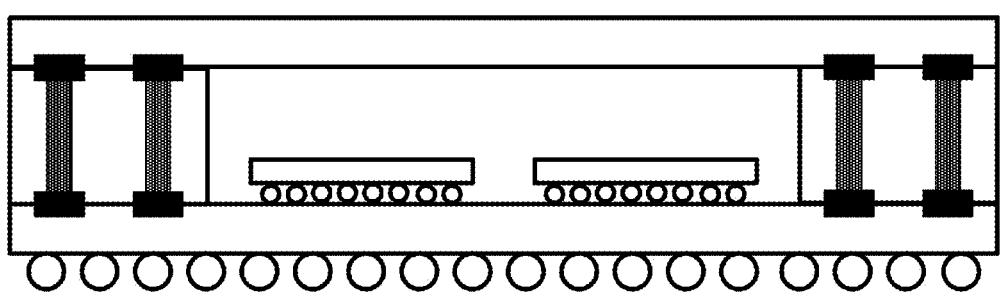
Figure 6C:
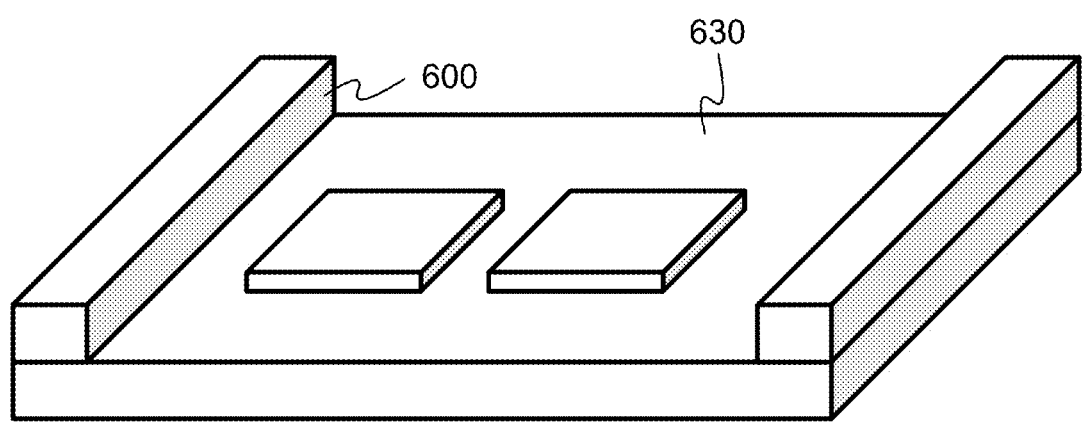
FIG. 6C is a perspective view of a portion of a semiconductor package with electronic components positioned in a clearance created by standoff interposers according to embodiments.

FIGS. 6A, 6B and 6C are side-view and perspective view schematics of interposers with electronic components positioned in a clearance created by standoff interposers according to embodiments. No cavity is created in interposer 630, however, clearance for die is provided by standoff interposers 600. Silicon cap 650 may be used to create a confined channel for fluid flow. Silicon cap 650 may include a redistribution layer on the bottom for routing electrical signals in the completed semiconductor package which is shown assembled in FIG. 6B. Silicon cap 650 (or a cap more generally) may include passive components or active components in embodiments. Silicon cap 650 may have no electrical connections on the top, according to embodiments, to increase security and to provide protection against probing by electrical taps. Alternatively, silicon cap 650 may be replaced by an interposer with through-connections such as through-substrate vias in embodiments. All elements of the package depicted in FIG. 6A can be manufactured separately and may have bonding pads (610, 620, 640) included for electrical connections in the assembled configuration of FIG. 6B. Thermocompression bonding or low temperature bonding method may be used to fuse all the elements together according to embodiments. The perspective view of FIG. 6C shows the assembled device with silicon cap 650 removed to allow viewing of some 3-d aspects of the semiconductor package. Standoff interposers 600 may be linearly parallel to one another as shown and may be positioned near two edges of interposer 630 to create a path for fluid or air flow in embodiments. Standoff interposers, interposers and caps may all be formed from the same semiconducting material (e.g. silicon), in embodiments, to match the coefficients of thermal expansion and reduce application of repetitive stresses.

The dimensions of interposers and standoff interposers described herein vary widely. Interposers may be as large as a full wafer, e.g. hundreds of millimeters across. Interposers may be as small as several millimeters across (e.g. 5 mm×5 mm). The interposers may be asymmetric as well for certain applications. Cavities may vary in dimensions as well and may depend on the size of the electronic component (e.g. a monolithic integrated circuit) ultimately placed within the cavity as well as the number of connections across the interposer outside the cavity (where the interposer-interposer direct connection is made). Cavity widths may be between 10% and 90%, 20% to 70% or 20% to 40% of the width of the interposer itself according to embodiments. Correspondingly, standoff interposer widths may be between 5% and 45%, between 15% and 40% or between 30% and 40% of the width of the interposer in embodiments. Cavity depths may be between 50 μm and 300 μm, between 75 μm and 250 μm or between 100 μm and 200 μm according to embodiments. Correspondingly, standoff interposer heights may be between 25 μm and 1,000 μm, between 50 μm and 300 μm, between 75 μm and 250 μm or between 100 μm and 200 μm according to embodiments. These dimensions apply to all embodiments described herein.

Figure 7A:
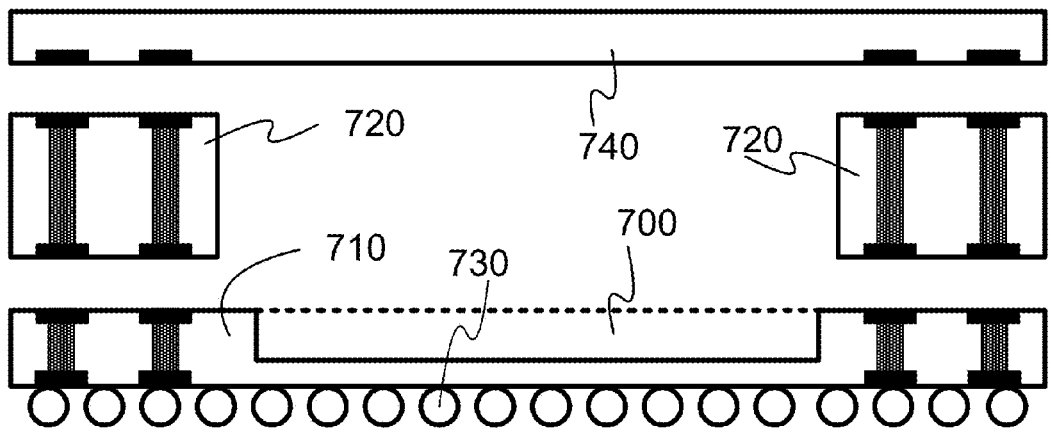
FIGS. 7A and 7B are side view schematics of portions of semiconductor packages with electronic components positioned in clearance formed by a combination of standoff interposers and a cavity according to embodiments.
Figure 7B:
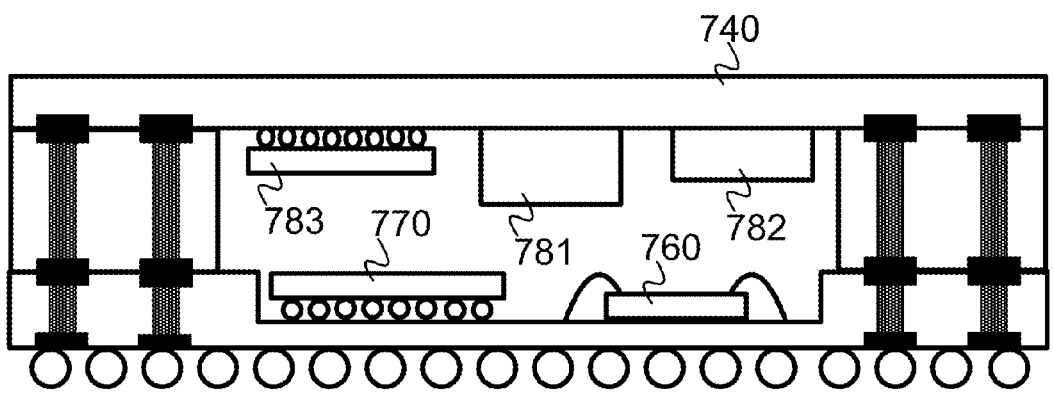

FIGS. 7A and 7B are side view schematics of interposers with electronic components positioned in clearance formed by a combination of standoff interposers and a cavity according to embodiments. A cavity 700 is formed on the top side of silicon interposer 710. Electrical components are then electrically and mechanically attached to silicon interposer 710 and attachment may occur prior to assembly in embodiments. The electrical components in the example include two (e.g. monolithic) integrated circuits 760 and 770. The electrical components may be entirely within cavity 700 according to embodiments (as with all components and cavities described herein). A silicon cap 740 is also formed and electrical components may be electrically and mechanically attached to the underside of silicon cap 740 in embodiments. FIG. 7B shows an integrated circuit 783, a passive electrical component 781 and an antenna 782. Electronic components will be used herein to describe integrated circuits or other active component, a passive electrical component such as an inductor, an antenna or a power source such as a battery according to embodiments. Integrated circuits may be used to refer to monolithic integrated circuits in embodiments. Standoff interposers 720 (which may be silicon as with all interposers herein) are also formed and used to attach a cap 740 to interposer 710 (each of which may also be silicon in all examples herein) and also to leave an additional clearance for the additional electronic components (783, 781 and 782). Standoff interposers 720 may also provide high density electrical routing and connectivity between interposer 710 and cap 740. Again, cap 740 may be included to improve security (as with all embodiments described herein) and also to confine a fluid flow channel to increase the speed and concentration of the coolant flow. The height of the cavity and/or the height of the silicon stand-off help determine the cooling effectiveness and may be selected based on thermal management considerations.

Figure 8A:
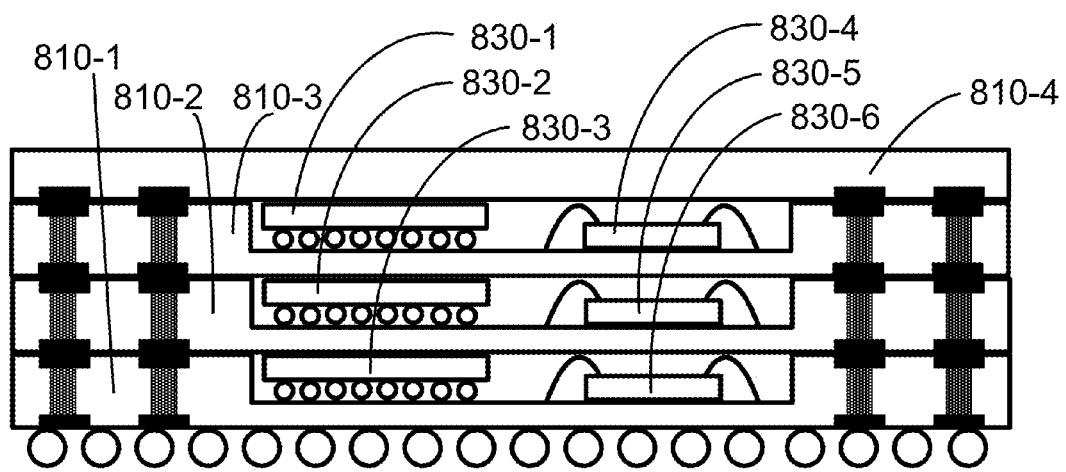
FIG. 8A is a side view schematic of a portion of a semiconductor package with electronic components positioned in multiple stacked cavities according to embodiments.

FIG. 8A is a side view schematic of a portion of a semiconductor package with electronic components positioned in multiple stacked cavities according to embodiments. FIG. 8A shows an embodiment where no silicon standoffs are used but electronic components 830 (e.g. monolithic integrated circuits) are placed among a plurality of vertically arranged cavities in a stack of interposers 810. Thermocompression or low temperature bonding may be used to bond interposers 810 directly together for enhanced miniaturization and to form a low profile package. In all embodiments herein, the clearances and/or cavities may or may not be filled with molding compound. All sides of the semiconductor packages described herein may be closed to enhance security especially in cases where the design does not require a coolant fluid (e.g. air) to be flowed through the channel to cool the (e.g. monolithic) integrated circuits.

Figure 8B:
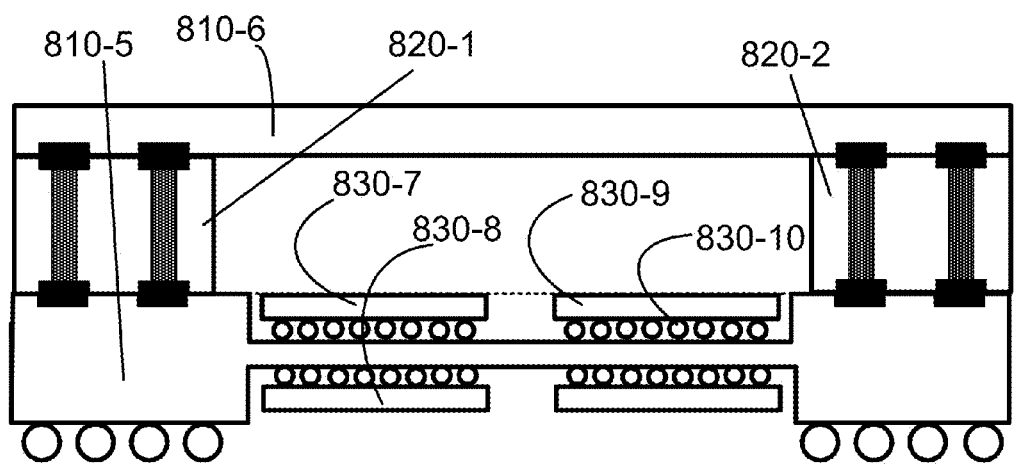
FIG. 8B is a side view schematic of a portion of a semiconductor package with electronic components positioned in cavities on both sides of a single interposer according to embodiments.

FIG. 8B is a side view schematic of a portion of a semiconductor package with electronic components positioned in cavities on both sides of a single interposer according to embodiments. Standoff interposers 820 are also present to create a clearance between interposer 810-5 and interposer 810-6. Note that the top interposers (810-4 and 810-6) may also be caps or silicon caps as before in embodiments. Electronic components 830 of FIG. 8B may be located entirely within cavities made in an interposer as shown. The cavities are defined as stopping at the top or bottom plane of the interposer (e.g. the dotted line) and the clearance begins at the dotted line and continues to the top or bottom surface of the nearest neighboring interposer. In other words, the clearance is defined by the height of standoff interposers 820. Electronic components may be placed partially or wholly inside a cavity, not only to increase packing density, but also to make electronic probing of the electrical connections (e.g. ball grid arrays) on the underside of the electronic components according to embodiments.

Figure 9A:
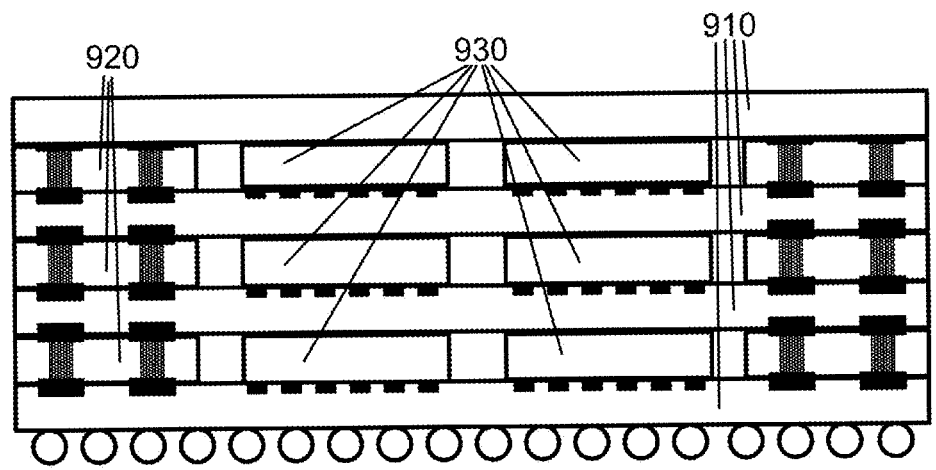
FIG. 9A is a side-view schematic of a portion of a semiconductor package with electronic components positioned in clearances created by standoff interposers according to embodiments.
Figure 9B:
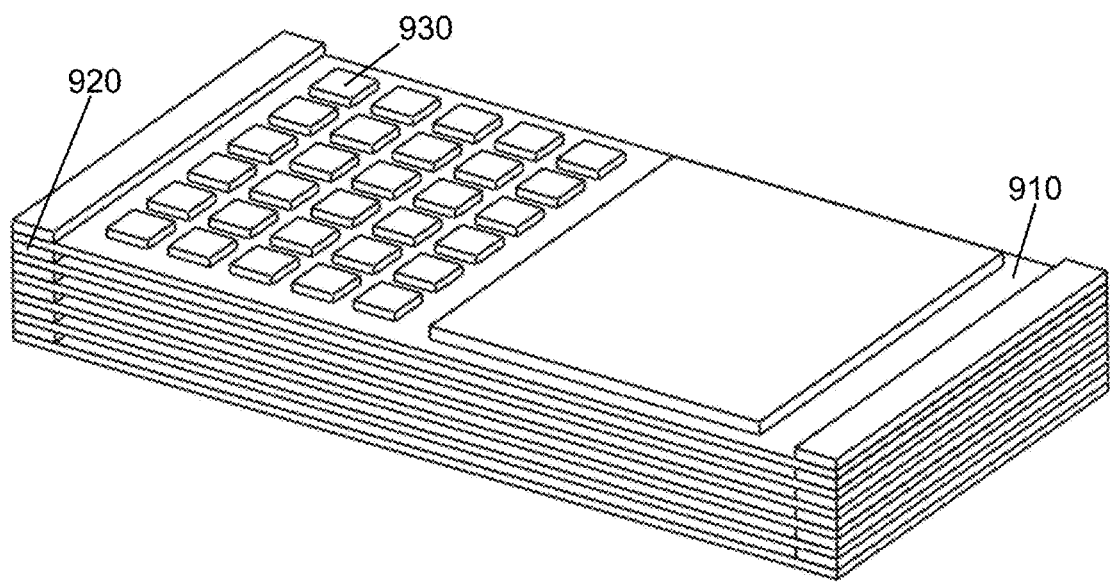
FIG. 9B is a perspective view of a portion of a semiconductor package with electronic components positioned in clearances created by standoff interposers according to embodiments.

FIGS. 9A and 9B are a side-view schematic and a perspective view of a portion of a semiconductor package with electrical components 930 positioned in clearances created by standoff interposers 920 according to embodiments. Components may be assembled using direct thermocompression or low temperature bonding methods on an interposer 910 without a cavity in embodiments. FIGS. 9A and 9B illustrate an example of a very low profile semiconductor package in which there is little or no gap on the side of the electrical component 930 opposite from the electrical and mechanical attachment according to embodiments. The height of the standoff interposers 920 may be the same or within 5% of the height of the electrical components 930 located on the same level in embodiments. The front and back of the semiconductor package (FIGS. 9A-9B) may still be left open to allow some small amount of cooling fluid flow.

Figure 10A:
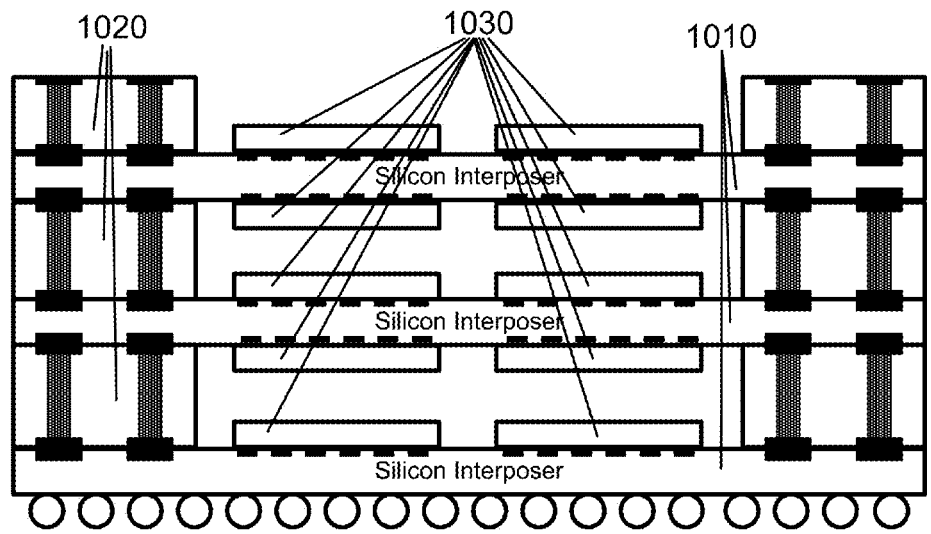
FIG. 10A is a side-view schematic of a portion of a semiconductor package with electronic components positioned in clearances created by standoff interposers according to embodiments.
Figure 10B:
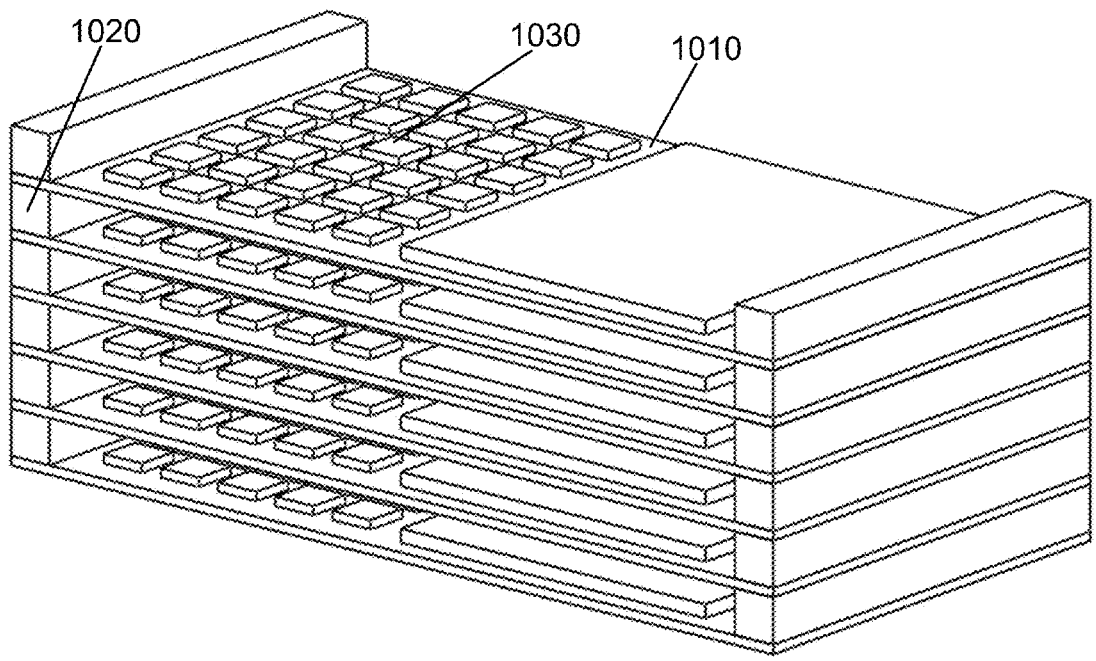
FIG. 10B is a perspective view of a portion of a semiconductor package with electronic components positioned in clearances created by standoff interposers according to embodiments.

FIGS. 10A and 10B are a side-view schematic and a perspective view of a portion of a semiconductor package with electrical components 1030 positioned in clearances created by standoff interposers 1020 according to embodiments. Components may be assembled using direct thermocompression or low temperature bonding methods on an interposer 1010 without a cavity in embodiments. Alternatively, solder balls may be used when the clearance is adequate according to embodiments. FIGS. 10A and 10B illustrate an example of a high electric component density semiconductor package in which there are electronic components 1030 near the top and bottom a clearance created by standoff interposers 1020 between interposers 1010 in embodiments. In applications where thermal generation is more significant, thicker standoff interposers may be used to create adequate passage for fluid flow according to embodiments. The height of the standoff interposers 1020 may be greater than twice the height of electronic components 1030 or greater than thrice the height of electronic components 1030 in embodiments. As with all embodiments described herein, the front and back of the semiconductor package (FIGS. 10A-10B) may be left open to allow some small amount of cooling fluid flow or else the remaining clearance may be filled with molding compound to encapsulate the electronic components 1030 according to embodiments.

Figure 11A:
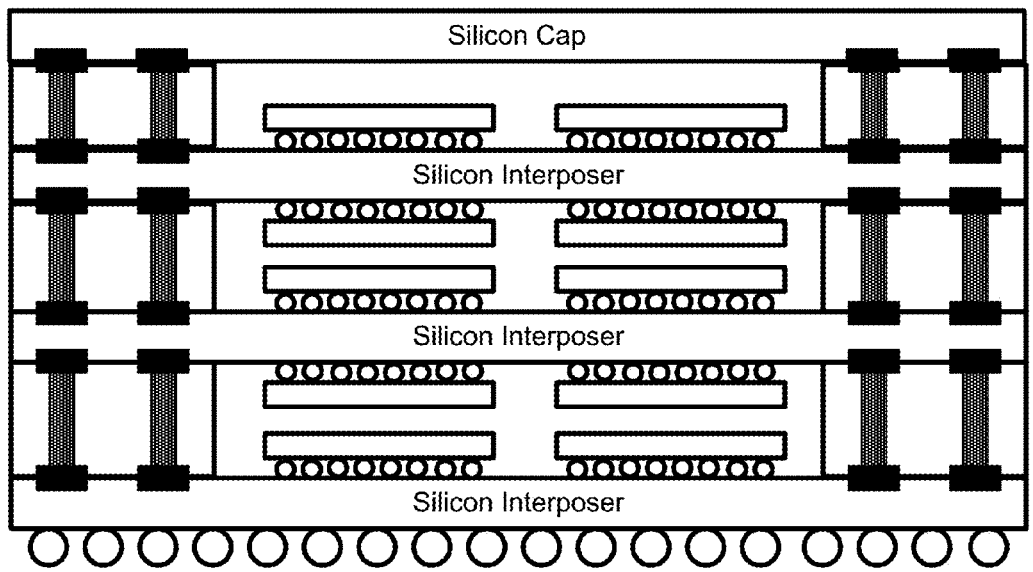
FIGS. 11A and 11B are side-view schematics of portions of semiconductor packages with electronic components positioned in clearances created by standoff interposers according to embodiments.
Figure 11B:
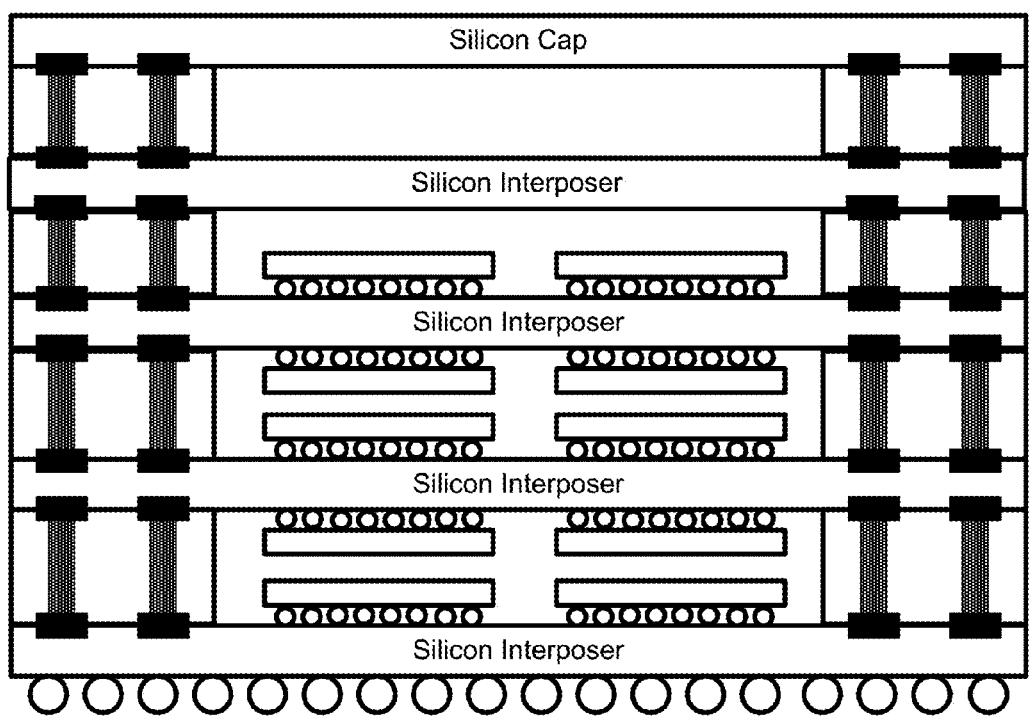
Figure 12A:
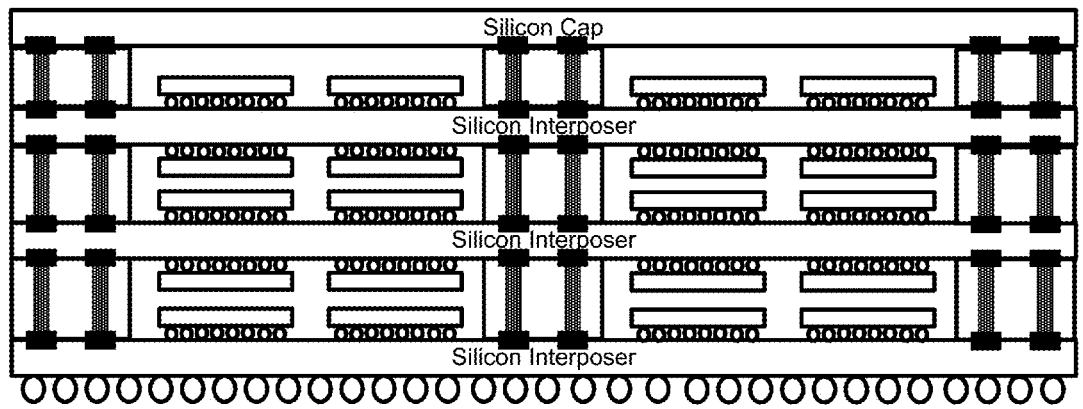
FIG. 12A is a side-view schematic of a portion of a semiconductor package with electronic components positioned in clearances created by standoff interposers according to embodiments.
Figure 12B:
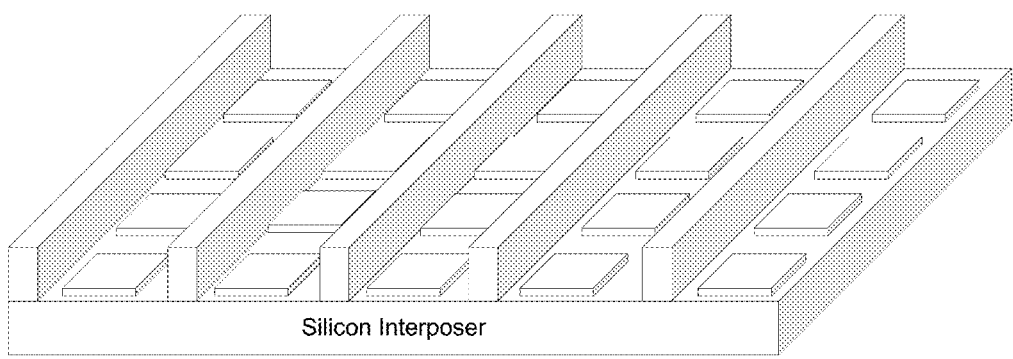
FIG. 12B is a perspective view of a portion of a semiconductor package with electronic components positioned in clearances created by standoff interposers according to embodiments.

FIGS. 11A and 11B are side-view schematics of portions of semiconductor packages with electronic components positioned in clearances created by standoff interposers according to embodiments. Embodiments implementing solder bumps in place of thermocompression or low temperature bonding are shown. A cap (e.g. an interposer cap or a silicon cap) may be incorporated at the top of the stack to increase security of the completed semiconductor package in embodiments. As with all embodiments described herein, electronic components may be assembled on interposers using solder bumps or copper pillars according to embodiments. The underside of the caps may be configured with redistribution layers but no connections may be present on the top or through the caps in embodiments. A semiconductor interposer right below the cap (e.g. the silicon cap in FIG. 11B) may provide additional routing channels on the top for routing signals or power according to embodiments. The cap on the top may contain one or more antennas to allow package-to-package or stack-to-stack wireless communication in embodiments. FIGS. 12A and 12B are side-view schematics of portions of semiconductor packages showing a standoff interposer between two other standoff interposers. Complex scalable systems may be formed using multiple standoff interposers placed at various intervals to allow high bandwidth chip-to-chip communication in embodiments. Three or more standoff interposers may be implemented to provide additional structure to a semiconductor package according to embodiments.

Figure 13A:
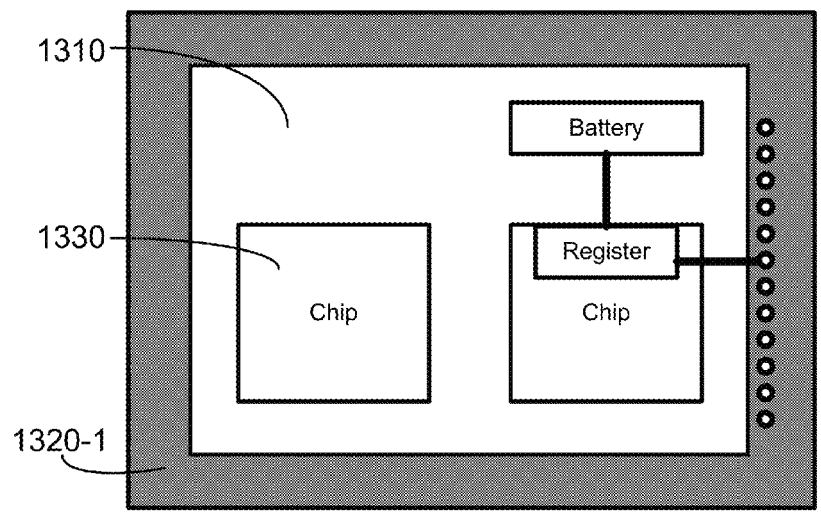
FIGS. 13A and 13B are top-view schematics of portions of semiconductor packages with electronic components positioned in clearances created by standoff interposers according to embodiments.
Figure 13B:
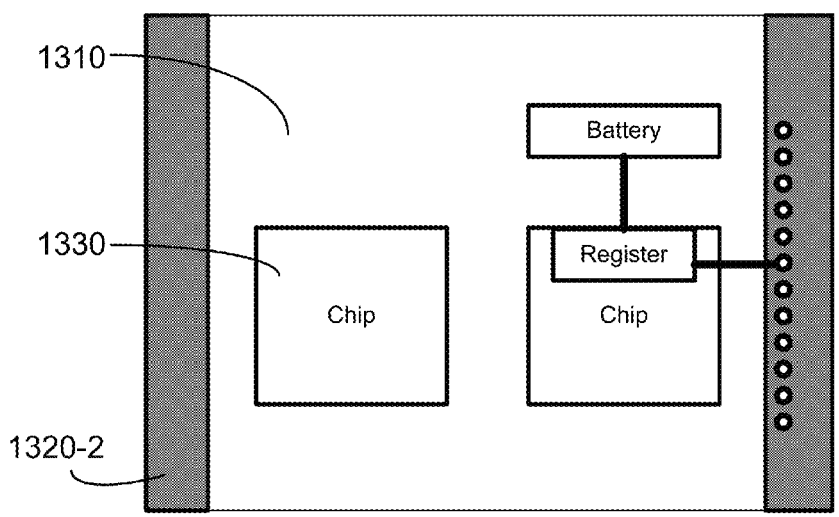

FIGS. 13A and 13B are top-view schematics of portions of semiconductor packages with electronic components positioned in clearances created by standoff interposers according to embodiments. Shown are interposer 1310, electronic component 1330, standoff interposer 1320, a battery and a storage register. Standoff interposer 1320-1 may encircle electronic components or standoff interposer 1320-2 may not encircle electronic components (which allows an air channel for example) in embodiments. Security may be increased by reducing or eliminating access to electrical signals within a semiconductor package in embodiments. An energy source (e.g. a battery) may be included, according to embodiments, to allow continued operation of electronic components for a period of time when power is interrupted. During this period of time, stored code may be executed which completes an operation such as a transfer, cleans up (e.g. zeros storage locations), scrambles and/or encrypts the data present in various memory locations in or near an integrated circuit (e.g. the storage register). The energy source is shown inside the package in FIGS. 13A and 13B but may be located outside or completely off the semiconductor package in embodiments.

Figure 14:
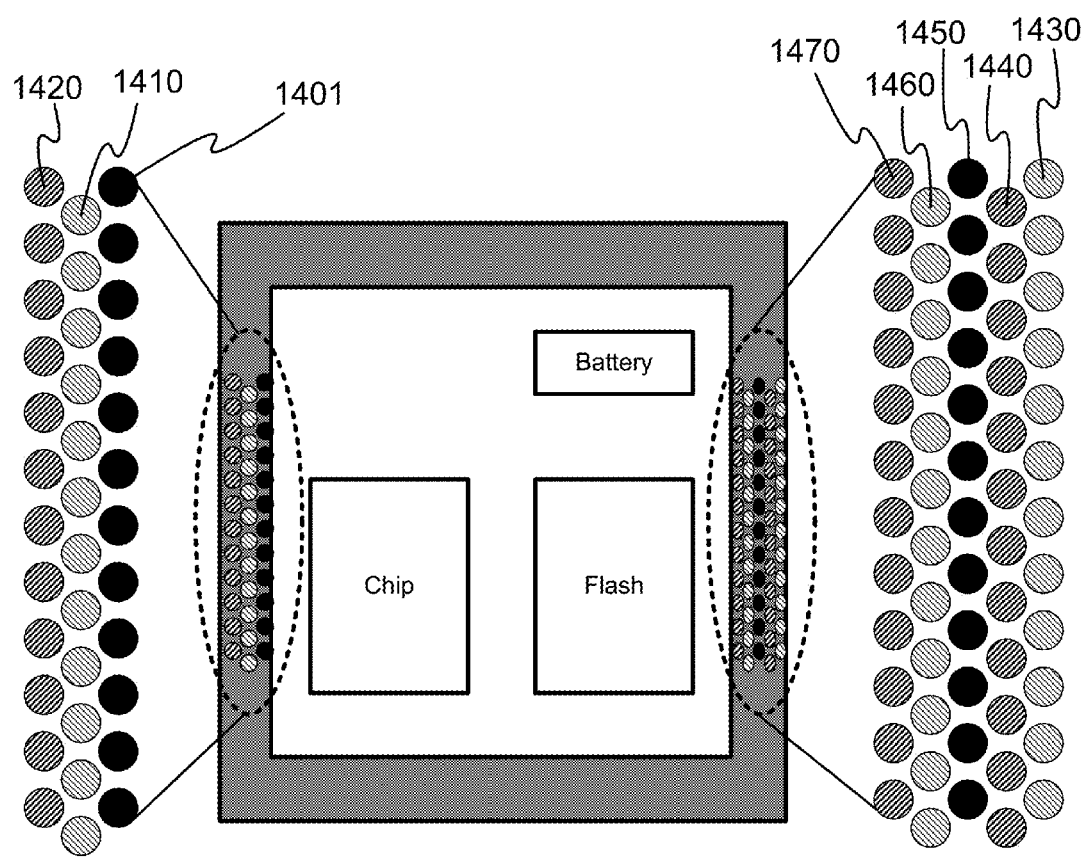
FIG. 14 is a top-view schematic of a portion of a semiconductor package with electronic components positioned in clearances created by standoff interposers according to embodiments.

FIG. 14 is a top-view schematic of a portion of a semiconductor package with electronic components positioned in clearances created by standoff interposers according to embodiments. The standoff interposer shown in FIG. 14 encircles electronic components as was the case for standoff interposer 1320-1 in FIG. 13A to increase security by making signals more difficult to tap into during operation in the field. Signal vias (1401, 1450) pass through the standoff interposer and expanded views are included as a visual convenience. Dummy vias (1410, 1420, 1430, 1440, 1460, 1470) may be included to obscure electromagnetic signals which may otherwise be read, e.g. outside the semiconductor package, according to embodiments. Two columns of dummy vias (1410, 1420) are included outside of signal vias 1401. The example involves dummy vias but dummy vias may also be replaced by power supply vias which then serve two purposes in embodiments. According to alternative embodiments, power supply vias may be protected by dummy vias since sensitive signals may sometimes ride on the power supply voltage. All vias which are helpful in shielding or obscuring sensitive signals may be referred to as signal-blocking vias. Two columns of dummy vias are shown outside (1430, 1440) and inside (1460, 1470) the signal vias 1450. The dummy vias may simply obscure an electromagnetic signal outside the semiconductor package or may conduct dummy/gibberish electrical signals intentionally included to further obscure the electromagnetic signal from signal vias (1401, 1450) or from power supplies in some cases. One column of dummy vias may be included on the outside or inside of a column of signal vias in embodiments. One column of dummy vias may be included on the outside and inside of a column of signal vias according to embodiments. Two or more columns of dummy vias may be included on the outside or inside of a column of signal vias in embodiments. The two (or more) columns of dummy vias may be staggered (as shown e.g. with dummy vias 1410 and 1420) to further avoid having meaningful electromagnetic signals pass to the outside of a semiconductor package according to embodiments. Generally speaking, a variety of signal transmission items may be used beyond the exemplary vias (1401, 1450). The signal transmission items may, for example, be vias, solder bumps or pads in embodiments.

Figure 15:
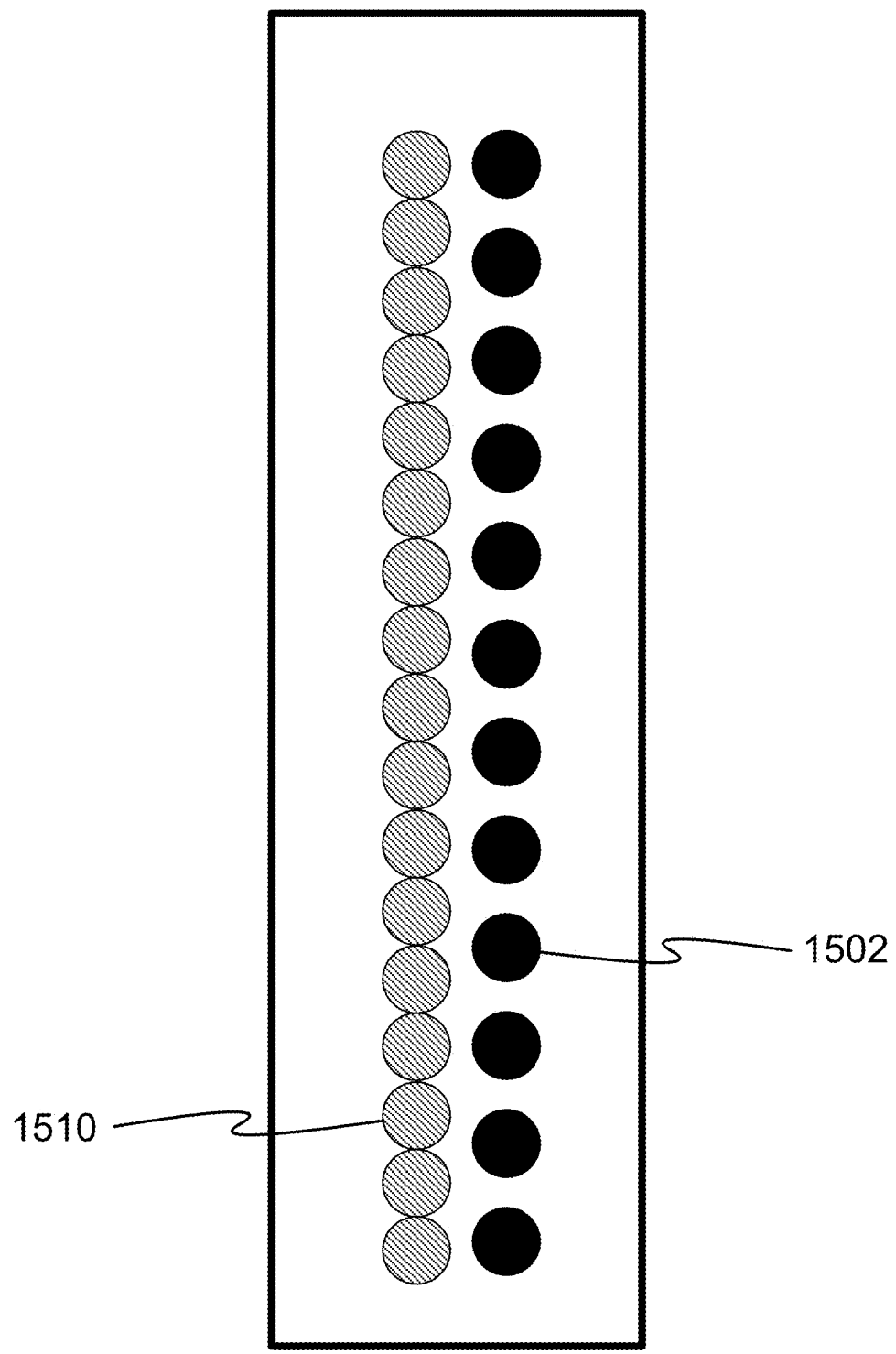
FIG. 15 is a top-view schematic of a portion of a standoff interposer according to embodiments.

FIG. 15 is a top-view schematic of a portion of a standoff interposer according to embodiments. Signal vias 1501 (or power vias in embodiments) may be shielded on the outside, the inside or both sides by a column of signal-blocking vias (e.g. ground supply, power supply or dummy vias 1510) according to embodiments. The column of signal-blocking vias 1510 (also referred to herein as cloaking vias) may be more closely spaced together compared to signal vias 1501 (or power vias in embodiments) to increase the security by discouraging propagation of electromagnetic signals outside a semiconductor package in embodiments.

FIGS. 16A, 16B, 16C and 16D are top-view schematics of portions of semiconductor packages according to embodiments. To further minimize or eliminate tampering with the package from top and bottoms sides a series of mesh is created to mask the signal traces on layer below. In embodiments, ground mesh 1610-1 is created on a layer (e.g. layer one in the figure) with power mesh 1601-1 created in staggered position with respect to layer one on a separate layer (e.g. layer two). The presence of ground mesh 1610-1, a dummy mesh (not shown) and/or power mesh 1601-1 may mask signal traces 1620 (and power traces in embodiments) routed on layer three increasing privacy and security. Ground mesh 1610-2 and power mesh 1601-2 may both be present on a single layer or each of multiple layers in embodiments. FIG. 16D shows power mesh 1601-2 and ground mesh 1610-2 on each of layer one and layer two to thwart attempts to tap the electromagnetic signals formed by signal traces 1620. These techniques may also be used inside or on the integrated circuits to improve security as well.

Figure 17:
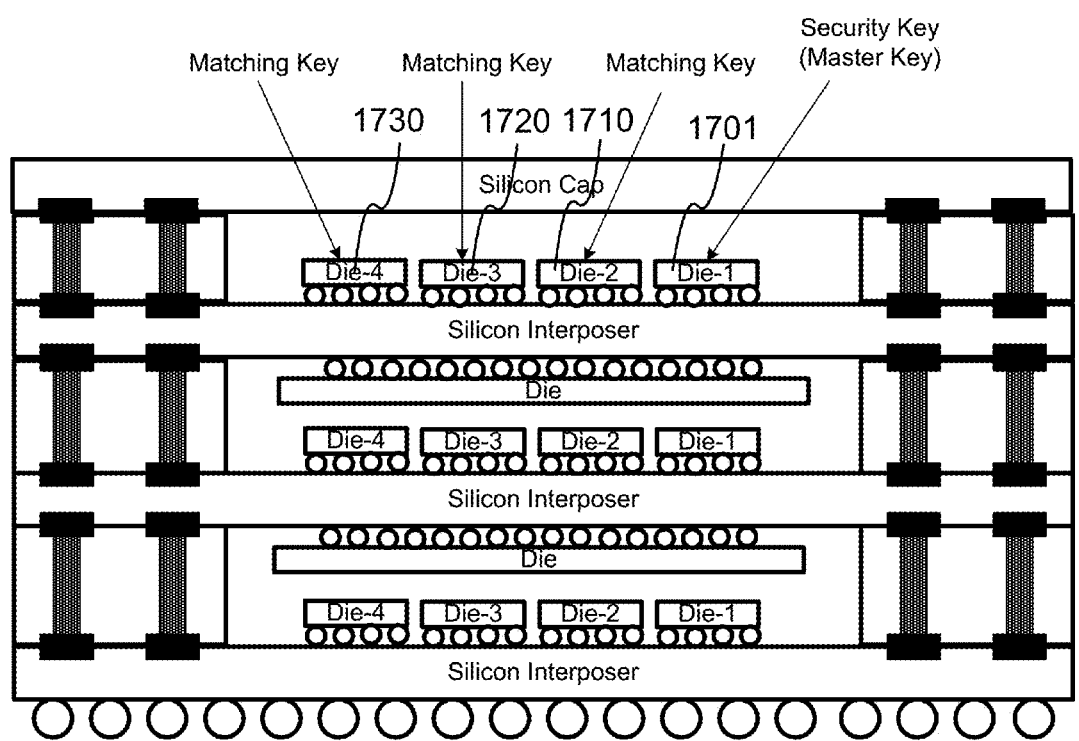
FIG. 17 is a side view schematic of a portion of a semiconductor package with keyed electronic components positioned within a clearance according to embodiments.

FIG. 17 is a side view schematic of a portion of a semiconductor package with keyed electronic components positioned within a clearance according to embodiments. A security code/master key may be stored inside integrated circuit 1701 in embodiments such that only select additional chips (also storing the corresponding key) may operate properly when present in the same semiconductor package. Integrated circuits (1710, 1720, 1730) are equipped with the proper security code in the example. According to embodiments, some or all keyed integrated circuits may be located within a clearance as shown, or located in a cavity according to embodiments. One or a plurality of integrated circuits may have the matching code to select the difficulty associated with a potential counterfeiting operation.

Electronic packages described herein may include high-performance miniature scalable and secure processing units equipped with a variety of integrated circuit types. A plurality of processors may be mounted on one side of an interposer while a plurality of memory dies may be mounted on the opposite side in embodiments. Processor cores may be mounted on one side of an interposer while memory is mounted on the opposite side according to embodiments. Processor cores and memory dies may be interspersed on both sides of an interposer in embodiments. According to embodiments, processor cores and memory dies may be both present on each side of an interposer but segregated into homogeneous integrated circuit groups. A homogeneous group of processor cores may be separated from a homogeneous group of memory dies by a standoff interposer in embodiments.

Figure 18A:
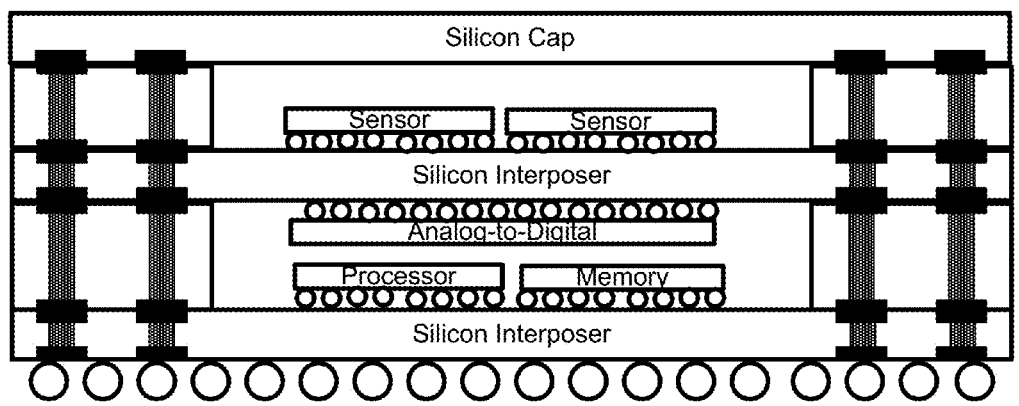
FIGS. 18A and 18B are side-view schematics of portions of semiconductor packages with electronic components positioned in clearances created by standoff interposers according to embodiments.
Figure 18B:
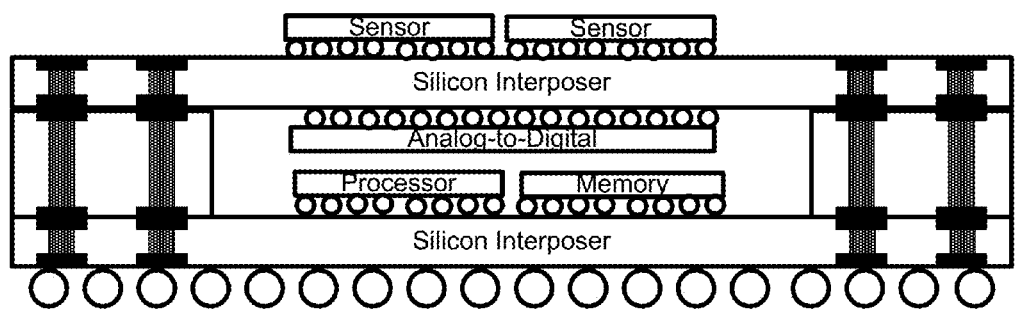

FIGS. 18A and 18B are side-view schematics of portions of semiconductor packages with electronic components positioned in clearances created by standoff interposers according to embodiments. Semiconductor packaged described herein may be scalable heterogeneous units for internet-of-things (IOT) applications. A plurality of sensors may be place on one side of the interposer while an analog-to-digital convertor maybe placed on the opposite side or same side as the sensors. Processors and memory units may be placed in the lower stacks of the semiconductor package. A cap (e.g. a silicon cap) may be used, in embodiments, in situations where the presence of a silicon cap may not interfere with the operation of the sensors (see FIG. 18A). Sensors may be placed on top of an uppermost interposer (FIG. 18B) to facilitate access of the sensors to environmental conditions.

Semiconductor packages described herein may include heterogeneous or homogeneous memory units in embodiments. Memory dies may be placed on one side or both sides interposers while high bandwidth standoff interposers may be used with bumps or compression bonding attachments method. Dimensions of the high bandwidth standoff interposers may be selected to manage heat generated during the operation of the electronic components (memory in this case).

Figure 19:
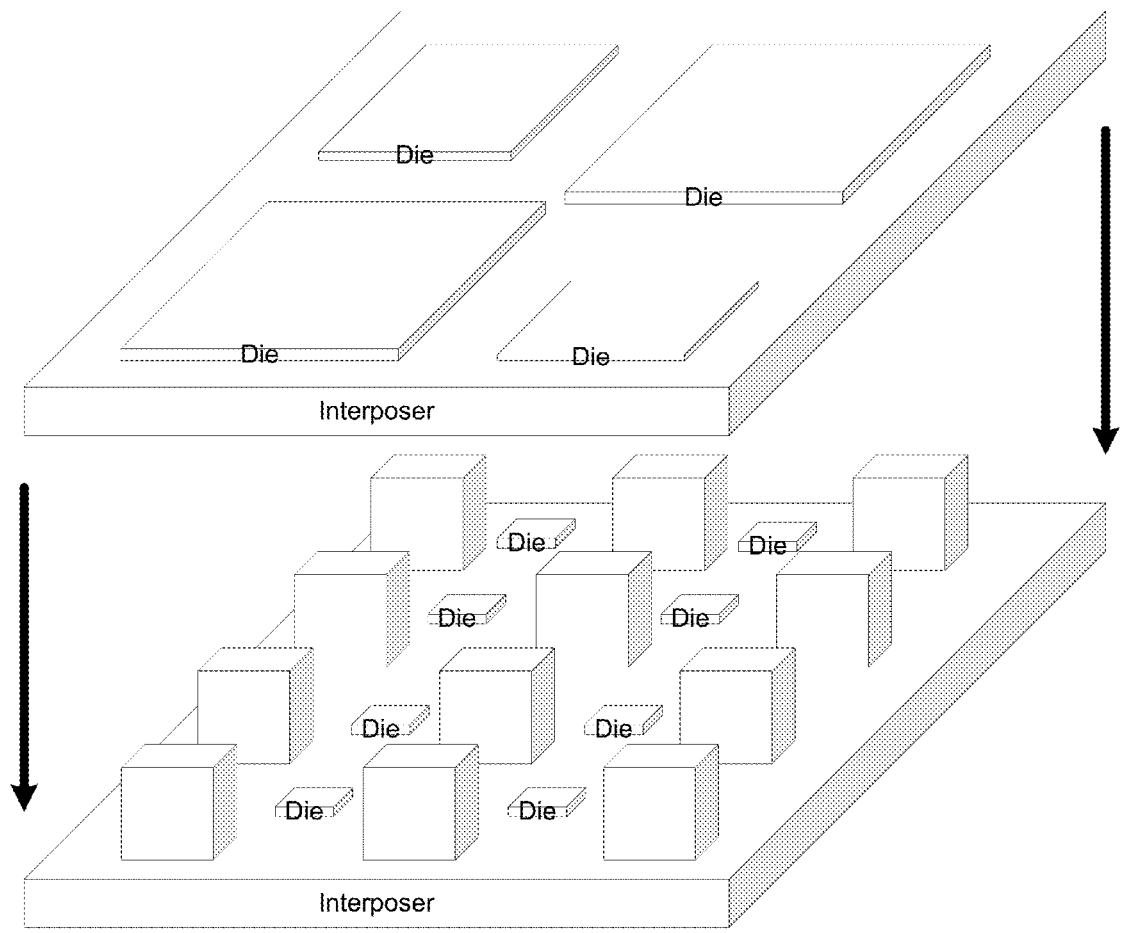
FIG. 19 is a perspective view of a portion of a semiconductor package according to embodiments.
Figure 20:
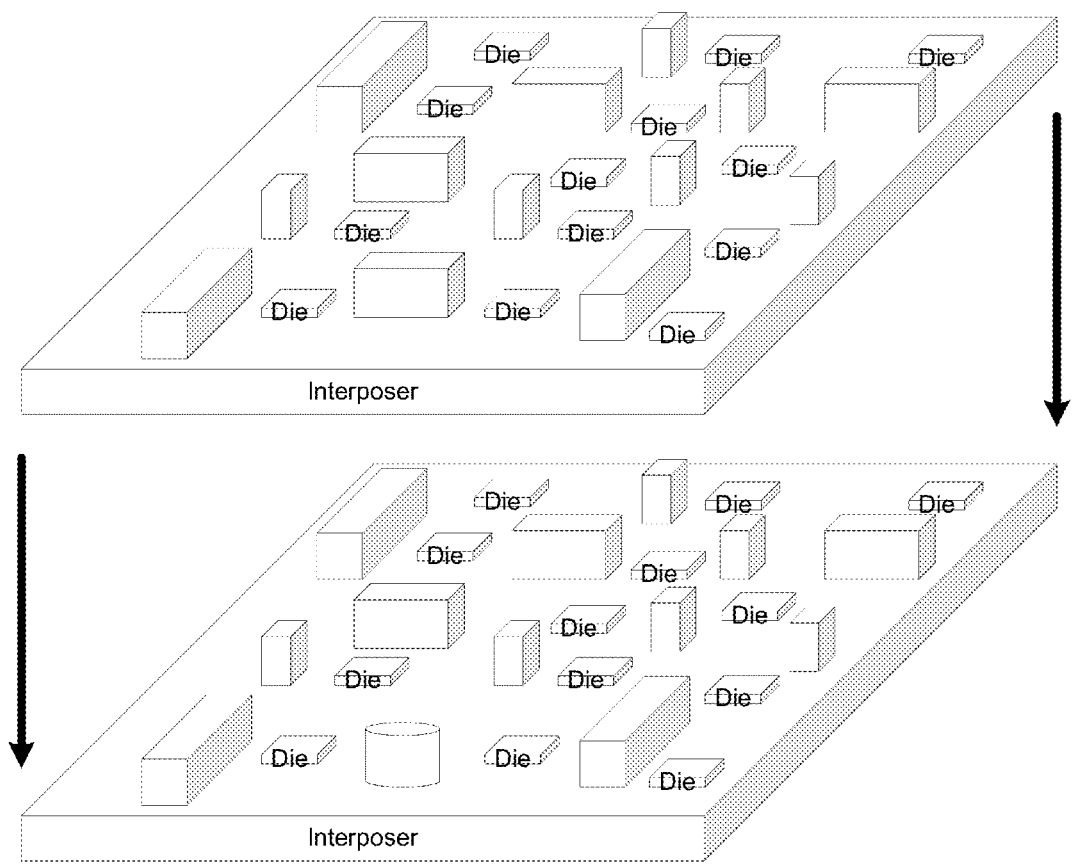
FIG. 20 is a perspective view of a portion of a semiconductor package according to embodiments.

FIG. 19 and FIG. 20 are perspective views of portions of semiconductor packages according to embodiments. Previous examples showed standoff interposers in the form of walls aligned in the same direction, in part, to guide airflow and promote cooling in embodiments. Standoff interposers may also be more discrete elements positioned at regular intervals in a two-dimensional array (FIG. 19) according to embodiments. FIG. 20 shows a more irregular distribution of standoff interposers still positioned discretely across the two-dimensional surface of an interposer. The distribution may be random in embodiments. Generally speaking, standoff interposers may be of any size or shape and may be located anywhere on the substrate to provide high speed and/or high bandwidth local connections among nearby electronic components (e.g. die as shown).

Semiconductor packages and devices formed according to the designs described herein may be used to form higher performance, cooler, more secure and tamper resistant, and more scalable 2.5D/3D heterogeneous systems than prior art designs.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. An electronic package comprising:
 a first semiconductor interposer, wherein the first semiconductor interposer comprises a first plurality of through-substrate vias perpendicular to the major plane of the first semiconductor interposer and passing through the entire thickness of the first semiconductor interposer;
 a second semiconductor interposer, wherein the second semiconductor interposer having a second major plane parallel to the first major plane and wherein the second semiconductor interposer comprises a second plurality of through-substrate vias perpendicular to the major plane of the second semiconductor interposer and passing through the entire thickness of the second semiconductor interposer;
 a first standoff interposer disposed between the first semiconductor interposer and the second semiconductor interposer, wherein the first standoff interposer is affixed to each of the first semiconductor interposer and the second semiconductor interposer;
 a second standoff interposer disposed between the first semiconductor interposer and the second semiconductor interposer, wherein the second standoff interposer is affixed to each of the first semiconductor interposer and the second semiconductor interposer;

a third standoff interposer disposed between the first semiconductor interposer and the second semiconductor interposer, wherein the third standoff interposer is affixed to each of the first semiconductor interposer and the second semiconductor interposer, and wherein the first standoff interposer is not affixed to the second standoff interposer, the first standoff interposer is not affixed to the third standoff interposer, the second standoff interposer is not affixed to the third standoff interposer, a first clearance is formed between the first standoff interposer, the second standoff interposer, the first semiconductor interposer, and the second semiconductor interposer, a second clearance is formed between the second standoff interposer, the third standoff interposer, the first semiconductor interposer, and the second semiconductor interposer, the first standoff interposer comprises an intervening plurality of through-substrate vias passing through an entire thickness of the first standoff interposer, the second standoff interposer comprises an intervening plurality of through-substrate vias passing through an entire thickness of the second standoff interposer, the third standoff interposer comprises an intervening plurality of through-substrate vias passing through an entire thickness of the third standoff interposer, and a portion of the second plurality of through-substrate vias are electrically connected to a portion of the first through-substrate vias by way of a portion of the intervening through-substrate vias;

a first electronic component disposed within the first clearance and electrically coupled to the first semiconductor interposer by a first plurality of electrical connections;

a second electronic component disposed within the first clearance and electrically coupled to one of the first semiconductor interposer or the second semiconductor interposer;

a third electronic component disposed within the second clearance and electrically coupled to the first semiconductor interposer; and a fourth electronic component disposed within the second clearance and electrically coupled to one of the first semiconductor interposer or the second semiconductor interposer, wherein the first electronic component and the second electronic component are spaced apart from one another, and the third electronic component and the fourth electronic component are spaced apart from one another.

2. The electronic package accordingly to claim 1, wherein a width of one of said first standoff interposer, said second standoff interposer, or said third standoff interposer is between 5% and 45% of a width of the first semiconductor interposer.

3. The electronic package accordingly to claim 1, wherein a height of one of said first standoff interposer, said second standoff interposer, or said third standoff interposer is between 25 μm and 1,000 μm.

4. A method of forming an electronic package, the method comprising:

forming a first semiconductor interposer, wherein the first semiconductor interposer comprises a first plurality of through-substrate vias perpendicular to the major plane of the first semiconductor interposer and passing through the entire thickness of the first semiconductor interposer;

forming a second semiconductor interposer, wherein the second semiconductor interposer having a second major plane parallel to the first major plane and wherein the second semiconductor interposer comprises a second plurality of through-substrate vias perpendicular to the major plane of the second semiconductor interposer and passing through the entire thickness of the second semiconductor interposer;

positioning a first standoff interposer between the first semiconductor interposer and the second semiconductor interposer, wherein the first standoff interposer is affixed to each of the first semiconductor interposer and the second semiconductor interposer;

positioning a second standoff interposer between the first semiconductor interposer and the second semiconductor interposer, wherein the second standoff interposer is affixed to each of the first semiconductor interposer and the second semiconductor interposer;

positioning a third standoff interposer between the first semiconductor interposer and the second semiconductor interposer, wherein the third standoff interposer is affixed to each of the first semiconductor interposer and the second semiconductor interposer, and wherein the first standoff interposer is not affixed to the second standoff interposer, the first standoff interposer is not affixed to the third standoff interposer, the second standoff interposer is not affixed to the third standoff interposer, a first clearance is formed between the first standoff interposer, the second standoff interposer, the first semiconductor interposer, and the second semiconductor interposer, a second clearance is formed between the second standoff interposer, the third standoff interposer, the first semiconductor interposer, and the second semiconductor interposer, the first standoff interposer comprises an intervening plurality of through-substrate vias passing through an entire thickness of the first standoff interposer, the second standoff interposer comprises an intervening plurality of through-substrate vias passing through an entire thickness of the second standoff interposer, the third standoff interposer comprises an intervening plurality of through-substrate vias passing through an entire thickness of the third standoff interposer, and a portion of the second plurality of through-substrate vias are electrically connected to a portion of the first through-substrate vias by way of a portion of the intervening through-substrate vias;

placing a first electronic component within the first clearance and electrically coupled to the first semiconductor interposer by a first plurality of electrical connections;

placing a second electronic component within the first clearance and electrically coupled to one of the first semiconductor interposer or the second semiconductor interposer;

placing a third electronic component within the second clearance and electrically coupled to the first semiconductor interposer; and electrically coupling a fourth electronic component within the second clearance and electrically coupled to one of the first semiconductor interposer or the second semiconductor interposer, wherein the first electronic component and the second electronic component are spaced apart from one another, and
the third electronic component and the fourth electronic component are spaced apart from one another.

* * * * *

UNITED STATES PATENT AND TRADEMARK OFFICE
CERTIFICATE OF CORRECTION

PATENT NO. : 9,818,680 B2
APPLICATION NO. : 14/746045
DATED : November 14, 2017
INVENTOR(S) : Farhang Yazdani Page 1 of 1

It is certified that error appears in the above-identified patent and that said Letters Patent is hereby corrected as shown below:

On the Title Page

Item (63), Related U.S. Application Data:
Please delete "Continuation of application No. 14/717,798, filed on May 20, 2015, which is a continuation of application No. 13/192,217, filed on Jul. 27, 2011."

Item (60), Related U.S. Application Data:
Please delete "Provisional application No. 62/015,459, filed on Jun. 22, 2014"
And replace with:
-- This application claims benefit of 62/015,459, filed June 22, 2014 and is a Continuation-in-Part of 14/717,798, filed May 20, 2015; which claims benefit of 62/002,794, filed May 24, 2014; and is a Continuation-in-Part of 13/192,217, filed July 27, 2011; which is a Continuation of 12/205,875, filed September 6, 2008, now U.S. Patent 8,014,166, issued September 6, 2011. --

Signed and Sealed this
Ninth Day of October, 2018

Andrei Iancu
*Director of the United States Patent and Trademark Office*